(12) United States Patent
Williams

(10) Patent No.: US 9,871,557 B2
(45) Date of Patent: Jan. 16, 2018

(54) RADIO FREQUENCY LEAKAGE DETECTION IN A CABLE PLANT

(71) Applicant: Cable Television Laboratories, Inc., Louisville, CO (US)

(72) Inventor: Thomas H. Williams, Louisville, CO (US)

(73) Assignee: Cable Television Laboratories, Inc., Louisville, CO (US)

( * ) Notice: Subject to any disclaimer, the term of this patent is extended or adjusted under 35 U.S.C. 154(b) by 0 days.

(21) Appl. No.: 15/276,263

(22) Filed: Sep. 26, 2016

(65) Prior Publication Data

US 2017/0019148 A1 Jan. 19, 2017

Related U.S. Application Data

(63) Continuation-in-part of application No. 14/812,916, filed on Jul. 29, 2015, now Pat. No. 9,455,766.

(60) Provisional application No. 62/030,345, filed on Jul. 29, 2014, provisional application No. 62/054,529, filed on Sep. 24, 2014, provisional application No. 62/146,848, filed on Apr. 13, 2015.

(51) Int. Cl.

| G01R 31/02 | (2006.01) |
| H04B 3/46 | (2015.01) |
| G01R 29/08 | (2006.01) |
| G01S 13/06 | (2006.01) |
| G01S 5/02 | (2010.01) |
| H04B 1/525 | (2015.01) |
| H04B 17/354 | (2015.01) |
| G01R 31/08 | (2006.01) |

(52) U.S. Cl.
CPC .......... *H04B 3/46* (2013.01); *G01R 29/0835* (2013.01); *G01R 31/025* (2013.01); *G01R 31/083* (2013.01); *G01S 5/02* (2013.01); *G01S 13/06* (2013.01); *H04B 1/525* (2013.01); *H04B 17/354* (2015.01); *G01R 31/08* (2013.01)

(58) Field of Classification Search
CPC .... G01R 31/083; G01R 31/08; G01R 31/025; G01R 29/0835; Y04S 10/522; H04B 3/46; G01S 13/06
See application file for complete search history.

(56) References Cited

U.S. PATENT DOCUMENTS

| 2012/0116697 A1* | 5/2012 | Stelle, IV | .............. H04N 17/00 702/59 |
| 2013/0229310 A1* | 9/2013 | Parks | .................... G01S 5/0221 342/417 |

* cited by examiner

*Primary Examiner* — Sophia Vlahos
(74) *Attorney, Agent, or Firm* — David Smith; Judson D. Cary

(57) ABSTRACT

Embodiments provided describe detections of RF leakage test signal emanating from cable plant. In one embodiment a single mobile receive antenna, connected to a complex demodulator mobile receiver, receives a stabilized test signal radiating from the cable plant. The test signal may be a known continuous wave (CW) carrier or other deterministic signal. The received test signal varies in phase as a function of a position of the mobile receive antenna relative to the location of a leakage antenna. The phase variance forms a Doppler shift as the test antenna moves relative to the leakage antenna. The receiver generates multiple in-phase (I) and quadrature (Q) test signal samples over a SPA (synthetic phased array) distance as the test antenna's travels, and the samples are inserted into a Fourier transform. The result of the transform is instantaneous Doppler frequency shift, from which a bearing angle can be computed.

8 Claims, 19 Drawing Sheets

RADIO FREQUENCY LEAKAGE DETECTION IN A CABLE PLANT

CROSS REFERENCE TO RELATED APPLICATIONS

The present application is a continuation in part of U.S. application Ser. No. 14/812,916 (filed Jul. 29, 2015) entitled "RADIO FREQUENCY LEAKAGE DETECTION IN A CABLE PLANT" which claims priority to, and thus the benefit of an earlier filing date from, U.S. Provisional Patent Application No. 62/030,345 (filed Jul. 29, 2014) entitled "LOCATING/IDENTIFYING CABLE PLANT ISSUES", U.S. Provisional Patent Application No. 62/054,529 (filed Sep. 24, 2014) entitled "VARIOUS COMMUNICATION SYSTEMS AND METHODS", and U.S. Provisional Patent Application No. 62/146,848 (filed on Apr. 13, 2015) entitled "SIGNAL LEAKAGE DETECTION USING SYNTHETIC PHASED ARRAYS", all of which are hereby incorporated by reference.

FIELD

This disclosure relates to the field of Radio Frequency (RF) signal detection, and in particular, to detecting RF leaks from a cable plant of a cable system operator.

BACKGROUND

Cable system operators use Radio Frequency (RF) signals transmitted over coaxial cables to provide television and data services to customers. Normally these RF signals do not cause interference when in compliance with Federal Communication Commission (FCC) rules that limit interference. However, in some cases the RF signals can leak. Cable signal leaks occur when the RF signals transmitted within the cable system are not contained within the cable plant. Cable signal leaks may be caused by loose connectors, damaged cables, unshielded housings, or unterminated cables.

A cable plant uses many of the same frequencies to transmit programming as licensed to over-the-air broadcasters. Cable operators are considered by the FCC to be secondary users of these frequencies, so they are precluded from interfering with licensed users who are the primary users of these frequencies.

Cable signal leakage can interfere with the over-the-air services that are using the same frequencies as the cable plant near the vicinity of an RF leak. This can interfere with ham radio operators, cellular radio, emergency responders, and aircraft navigation systems. When interference from the cable plant occurs, it can hamper or endanger others.

The FCC has set maximum individual signal leakage levels for cable systems. The FCC is stricter with signal leakage levels for cable systems that interfere with aeronautical and/or navigation communications. Therefore, the FCC requires cable operators to have a periodic, on-going program to inspect, locate, and repair RF leaks in their cable plants. However, locating RF leaks in a cable plant can be difficult and time consuming, due to the complexity and size of a typical cable plant.

Cable system operator use Radio Frequency (RF) signals transmitted over coaxial cables to provide television and data services to customers. Normally these RF signals do not cause interference when the shielding integrity is good, but sometime damage occurs. Damage may be caused by corrosion, animal chews, craft error, or mechanical stress. When there is damage to cable shielding, cable signals may leak out causing interference with wireless services. Many of the RF frequencies used inside the coaxial cable are the same frequencies used for a variety of wireless communication services, such as aviation signals, Ham radio signals, broadcast signals and wireless LTE (long term evolution) 2-way communications. Additionally, when there is shield damage allowing signal egress, it may be accompanied by signal ingress, where cable services are negatively affected by wireless signals or electrical noise. The FCC has published leakage limits for field strength. One limitation with legacy leakage detection equipment is that when a distance between the leakage signal's source and a receiving antenna is not known, it is not possible to calculate if the field strength exceeds FCC limits at a test distance, which may be at 3 meters or 30 meters. Thus, there is a need to know measurement distance to calculate if a detected leak exceeds FCC limits.

SUMMARY

Embodiments described herein provide for the detection of RF leaks in a coaxial cable of a cable plant utilizing various analytical techniques that are applied to the RF signals emitted from the RF leaks. These analytical techniques provide information about an RF leak that reduces the amount of effort and time that may be required to locate the RF leak in the cable plant.

One embodiment comprises a mobile device that is configured to detect RF leaks emanating from a coaxial cable of a cable plant. The mobile device includes an antenna that is configured to receive an RF signal from an RF leak in the coaxial cable. The mobile device further includes a quadrature demodulator that is configured to demodulate the RF signal to generate In-phase and Quadrature (IQ) data, and a controller. The controller is configured to determine changes in a phase angle of the RF signal based on the IQ data generated as the mobile device is in motion. The controller is further configured to identify that the mobile device is travelling toward the RF leak responsive to determining that the phase angle is advancing, and to identify that the mobile device is travelling away from the RF leak responsive to determining that the phase angle is retarding.

Another embodiment comprises a method for detecting RF leaks emanating from a coaxial cable of a cable plant. The method comprises receiving, by an antenna of a mobile device, an RF signal from an RF leak in the coaxial cable. The method further comprises demodulating the RF signal to generate IQ data, and determining changes in a phase angle of the RF signal based on the IQ data generated as the mobile device is in motion. The method further comprises identifying that the mobile device is travelling towards the RF leak responsive to determining that the phase angle is advancing, and identifying that the mobile device is travelling away from the RF leak responsive to determining that the phase angle is retarding.

Another embodiment is a non-transitory computer readable medium embodying programmed instructions which, when executed by a processor of a mobile device, detects RF leaks emanating from a coaxial cable of a cable plant. The instructions direct the processor to receive, by an antenna of the mobile device, an RF signal from an RF leak in the coaxial cable. The instructions further direct the processor to demodulate the RF signal to generate IQ data, and to determine changes in a phase angle of the RF signal based on the IQ data generated as the mobile device is in motion. The instructions further direct the processor to identify that the mobile device is traveling towards the RF leak responsive to determining that the phase angle is advancing. The instructions further direct the processor to identify that the mobile device is traveling away from the RF leak responsive to determining that the phase angle is retarding.

The above summary provides a basic understanding of some aspects of the specification. This summary is not an extensive overview of the specification. It is intended to neither identify key or critical elements of the specification nor delineate any scope particular embodiments of the specification, or any scope of the claims. Its sole purpose is to present some concepts of the specification in a simplified form as a prelude to the more detailed description that is presented later.

Embodiments described herein provide for the detection of RF leaks in coaxial network utilizing various analytical techniques that are applied to RF signals emitted from the RF leaks, or probing RF signals applied to the coaxial network to discover shielding defects. These analytical techniques provide information about shielding defects that reduce the amount on time and effort that may be required to locate and repair the shielding defect.

In one embodiment a mobile test antenna receives a leakage test signal radiated from a leakage antenna created by a shield break in the cable plant. The antenna is connected to a mobile receiver with a complex demodulator producing in-phase (I) and quadrature (Q) samples periodically. I-Q samples, which contain information about the magnitude and phase of one or more leakage antennas, are inserted into a Fourier transform, which produce Doppler frequency components for each leakage antenna. The Doppler frequency components may each be processed with an arc cosine function to reveal bearing angles to each leakage antenna, as well as strength of the leakage signal. After the mobile antenna moves a distance, the intersection of another bearing angle with the first bearing angle reveals the position of the leaks.

In another embodiment another embodiment a second mobile test antenna is used to resolve whether the leak is on the left or right side of the drive path.

In another embodiment, a mobile transmit antenna, connected to a mobile test signal transmitter, transmits a leakage signal which is received by a leakage antenna and relayed over cable line to a stationary receiver. The position of the mobile transmit antenna during the test may be sent wirelessly to a stationary receiver, so the latitude and longitude of the leakage antennas can be determined.

In another embodiment a second mobile transmitting antenna is used to resolve left-right ambiguity.

In another embodiment a single antenna with a position reporting capability is moved by a technician, and I-Q field strength is recorded along with position as the antenna is moved. The result is a spatial map of electromagnetic field in a space that is analyzed for the leakage source.

DESCRIPTION OF THE DRAWINGS

Some embodiments are now described, by way of example only, and with reference to the accompanying drawings. The same reference number represents the same element or the same type of element on all drawings.

DESCRIPTION

The figures and the following description illustrate specific exemplary embodiments. It will thus be appreciated that those skilled in the art will be able to devise various arrangements that, although not explicitly described or shown herein, embody the principles of the embodiments and are included within the scope of the embodiments. Furthermore, any examples described herein are intended to aid in understanding the principles of the embodiments, and are to be construed as being without limitation to such specifically recited examples and conditions. As a result, the inventive concept(s) is not limited to the specific embodiments or examples described below, but by the claims and their equivalents.

Figure 1:
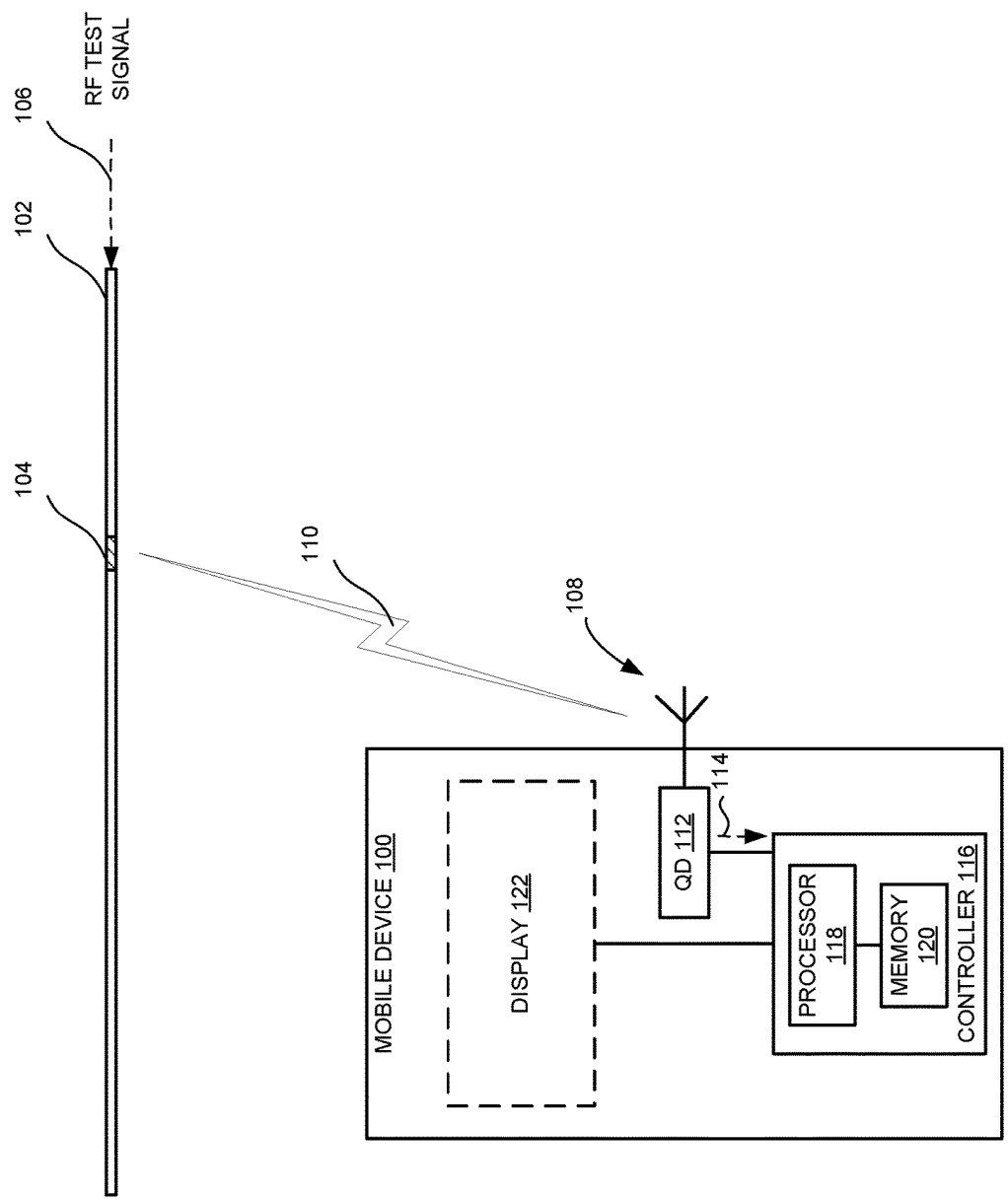
FIG. 1 is a block diagram of a mobile device that detects RF leaks emanating from a coaxial cable of a cable plant in an exemplary embodiment.

FIG. 1 is a block diagram of a mobile device 100 that detects RF leaks emanating from a coaxial cable of a cable plant in an exemplary embodiment. For purposes of discussion, a coaxial cable 102 is illustrated in FIG. 1 that is part of a cable plant. Coaxial cable 102 includes an inner conductor (not shown) that is surrounded by a tubular insulation layer (not shown). The tubular insulation layer is surrounded by a tubular outer shield (not shown).

In this embodiment, coaxial cable 102 is utilized by a cable operator to distribute television and/or data services to customers. Cable operators typically transmit using some of the same frequencies over coaxial cables (e.g., coaxial cable 102) that are licensed for over-the-air broadcasts. For instance, a cable plant may utilize frequencies of up to about 1 gigahertz (GHz), which may interfere (if there are RF leaks) with any number of critical radio services in the US, such as local fire departments (154.28 MHz), local and state search and rescue (155.160 MHz), National Guard (163.4875 MHz), the US Air Force (311.00 MHz), and many others.

To prevent the cable plant from interfering with licensed spectrum, the FCC requires that cable operators routinely inspect their cable plants to determine if any RF leaks are present. For purposes of discussion, coaxial cable 102 in FIG. 1 is illustrated with an RF leak 104 that is detectable by mobile device 100.

RF leak 104 may be caused by damage to coaxial cable 102. Some examples of the types of damage that may occur at coaxial cable 102 include broken tubular outer shields, loose connectors, damaged RF gaskets on housings, etc. In this embodiment RF leak 104 generates an RF signal 110, which corresponds with an RF test signal 106 that is transmitted along coaxial cable 102. RF test signal 106 may be a Continuous Wave (CW) test signal in some embodiments. For instance, RF test signal 106 may be an 800 megahertz (MHz) CW signal that is injected along coaxial cable 102 to allow mobile device 100 to detect RF leak 104. However, 800 MHz is just one possible frequency that may be transmitted along coaxial cable 102, with other options being any frequency that may be supported by the bandwidth of coaxial cable 102. In some embodiments, RF test signal 106 may include pilot signals that are used for automatic gain and slope control of data signals transmitted by coaxial cable 102. RF test signal 106 may also include data signals utilized by a cable plant to provide television and/or data services to customers in some embodiments.

In this embodiment, mobile device 100 includes an antenna 108 that is capable of receiving RF signal 110 that is generated by RF leak 104. Antenna 108 includes any electrical device that is able to convert RF signal 110 into an electrical current and/or voltage. Mobile device 100 also includes a quadrature demodulator (QD) 112, that generates IQ data 114. Quadrature demodulation is sometimes referred to as IQ demodulation, or complex demodulation. QD 112 demodulates RF signal 110, and generates both an in-phase component (I) and a quadrature component (Q) of RF signal 110 relative to a frequency source (not shown) used for demodulation. For instance, if RF test signal 106 is a 800 MHz CW test signal, then the QD 112 may utilize an 800 MHz frequency source to demodulate RF signal 110 and generate IQ data 114, which would represent changes in the phase and magnitude of RF signal 110. QD 112 in this embodiment includes any electronic device that is able to demodulate RF signal 110, and to generate both an in-phase and a quadrature component for RF signal 110.

IQ data 114 is proved to a controller 116, which is able to analyze IQ data 114 to enable mobile device 100 to detect information about RF leak 104. For instance, controller 116 may be able to analyze IQ data 114 to identify whether mobile device 110 is moving toward or away from RF leak 104, may be able to analyze IQ data 114 to determine a bearing and/or a location of RF leak 104, may be able to analyze IQ data 114 to identify frequency shifts in RF signal 110 etc. To do so, controller 116 may utilize any electronic device that is capable of performing such functionality. While the specific hardware implementation of controller 116 is subject to design choices, one particular embodiment may include one or more processors 118 coupled with a memory 120. Processor 118 includes any electronic device that is able to perform functions. Processor 118 may include one or more Central Processing Units (CPU), microprocessors, Digital Signal Processors (DSPs), Application-specific Integrated Circuits (ASICs), etc. Some examples of processors include Intel® Core™ processors, ARM® processors, etc.

Memory 120 includes any electronic device that is able to store data. For instance, memory 120 may store IQ data 114 during processing. Memory 120 may include one or more volatile or non-volatile Dynamic Random Access Memory (DRAM) devices, FLASH devices, volatile or non-volatile Static RAM devices, hard drives, Solid State Disks (SSDs), etc. Some examples of non-volatile DRAM and SRAM include battery-backed DRAM and battery-backed SRAM.

Mobile device 100 in some embodiments includes a display 122, which allows a user (not shown in FIG. 1) to interact visually with mobile device 100. Display 122 includes any electronic device that is capable of displaying information to a user. One example of display 122 includes a Liquid Crystal Display (LCD), which may include a touch interface that allows the user to control mobile device 100.

Consider that a user is in the field with mobile device 100, and is attempting to locate RF leak 104 in coaxial cable 102. RF test signal 106 is transmitted along coaxial cable 102 during the testing process. RF test signal 106 may be introduced at a downstream portion of the cable plant relative to coaxial cable 102, may include pilot or training signals utilized by the cable plant, and/or may include data signals provided by the cable plant to customers.

Figure 2:
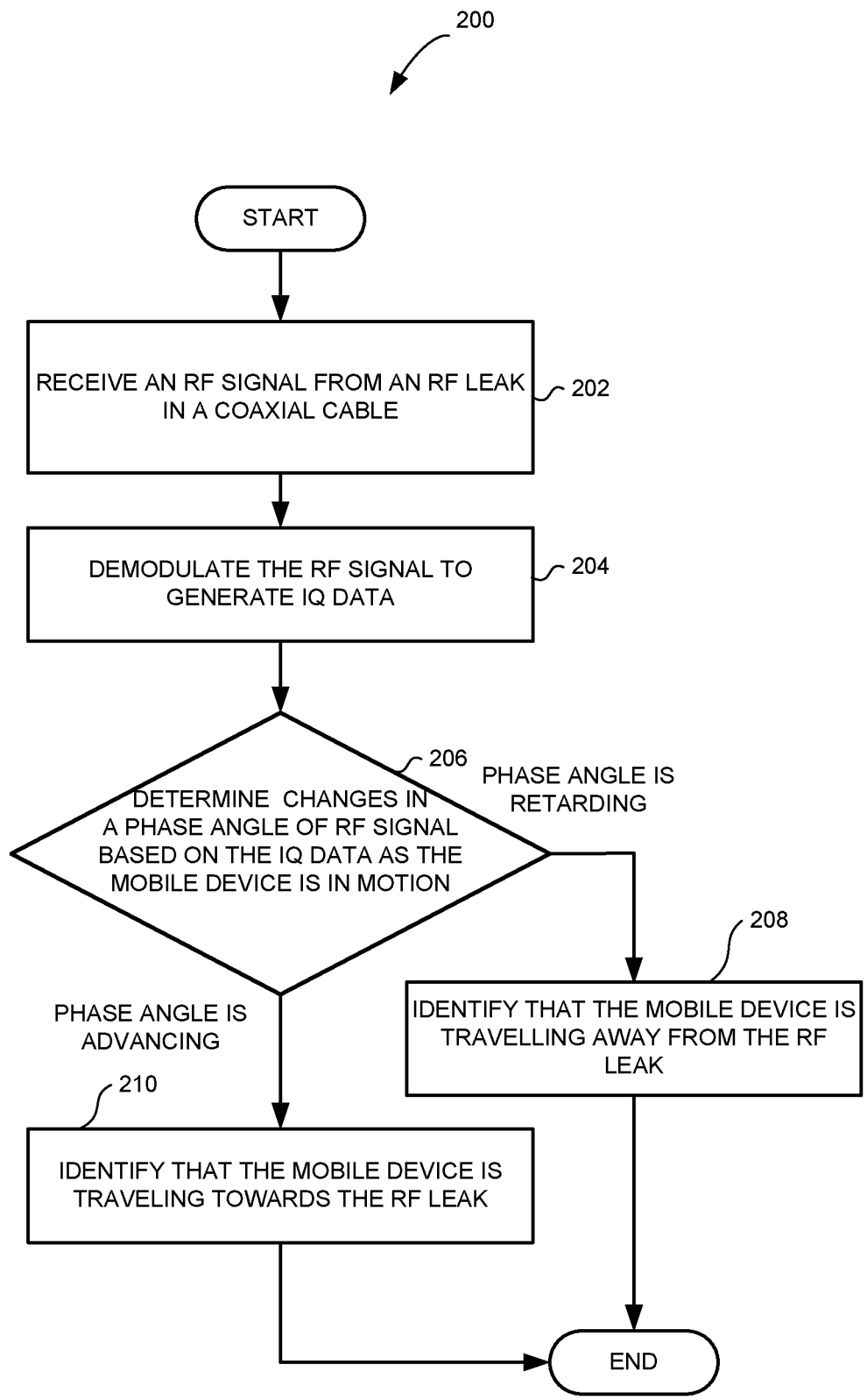
FIG. 2 is flow chart of a method for detecting RF leaks emanating from a coaxial cable of a cable plant in an exemplary embodiment.

FIG. 2 is flow chart of a method 200 for detecting RF leaks emanating from a coaxial cable of a cable plant in an exemplary embodiment. Method 200 will be discussed with respect to mobile device 100, although method 200 may be performed by other systems, not shown. The steps of the flow charts described herein may include other steps that are not shown. Also, the steps of the flow charts described herein may be performed in an alternate order.

Mobile device 100 begins the testing phase of coaxial cable 102 by receiving RF signal 110 at antenna 108 (see step 202 of FIG. 2). To do so, a user may carry mobile device 100 proximate to coaxial cable 102, a user may be driving nearby coaxial cable 102 with mobile device 100 in a vehicle, etc. The RF signal 110 is demodulated by QD 112 to generate IQ data 114, which is provided to processor 118 of controller 116. In some embodiments, RF test signal 106 may comprise a CW test signal at a known frequency. In this case, QD 112 may use a reference source at the known frequency to demodulate RF signal 110, with IQ data 114 representing the in-phase (I) and quadrature (Q) differences between RF signal 110 and the source. In other embodiments, RF test signal 106 may comprise a broadband test signal having a pre-determined pattern. For instance, RF test signal 106 may comprise pre-defined Orthogonal Frequency Division Multiplexed (OFDM) test patterns, such as pilot subcarriers used in Data Over Cable Service Interface Specification (DOSCIS®) used by a customer's cable modem to adapt to changing channel conditions.

Processor 118 analyzes IQ data 114, and determines changes in a phase angle of RF signal 110 generated as mobile device 100 is in motion (see step 206). For instance, processor 118 may monitor changes in the phase angle as the user carries mobile device 100 along coaxial cable 102. Changes to the phase angle result from mobile device 100 moving with respect to RF leak 104. For instance, if RF test signal 106 is an 800 MHz CW signal, then a wavelength of RF signal 110 generated by RF leak 104 is about 37.5 centimeters (cm). As mobile device 100 is moved closer to RF leak 104, the phase angle of RF signal 110 advances. For example, if mobile device 100 is moved 10 cm directly towards RF leak 104, then processor 118 would be able to determine that the phase angle of RF signal 110 advances by about (10/37.5)*360 degrees, or about 96 degrees. In like manner, if mobile device 100 is moved 10 cm directly away from RF leak 104, then processor 118 would be able to determine that the phase angle of RF signal 110 is retarding by about 96 degrees. However, it is not necessary that mobile device 100 be traveling directly toward or away from RF leak 104 in order to identify changes in the phase angle of RF signal 110.

If processor 118 determines that the phase angle of RF signal 110 is retarding, then processor 118 will identify that mobile device 100 is traveling away from RF leak 104 (see step 208). For instance, processor 118 may indicate such on display 122 in some embodiments. If processor 118 determines that the phase angle of RF signal 110 is advancing, then processor 118 will identify that mobile device 100 is traveling towards RF leak 104 (see step 210). For instance, processor 118 may indicate such on display 122 in some embodiments.

Accurately identifying small changes in the phase angle of RF signal 110 may depend upon a number of factors, including the stability of the frequency of RF test signal 106, the stability of the source frequency used by QD 112 to demodulate RF signal 110, etc. Therefore, mobile device 100 may include a highly stable frequency source. For instance, mobile device 100 may include a Rubidium-based frequency standard and/or an oscillator locked to a Global Positioning System (GPS) signal, which may be used by QD 112 to demodulate RF signal 110.

Figure 3:
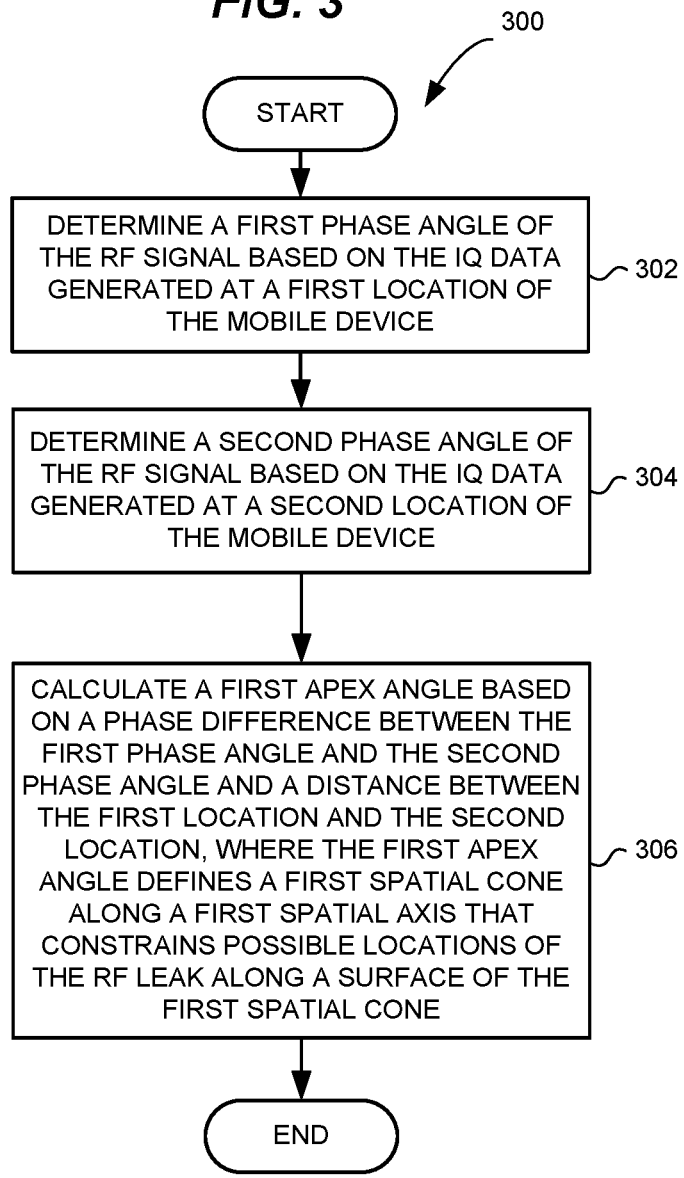
FIG. 3 is a flow chart of another method for detecting an RF leak emanating from a coaxial cable plant in an exemplary embodiment.

FIG. 3 is a flow chart of another method 300 of detecting an RF leak emanating from a coaxial cable plant in an exemplary embodiment. Method 300 will be discussed with respect to mobile device 100, although method 300 may be performed by other systems, not shown. In this embodiment, information about RF leak 104 can be determined by determining phase changes in RF signal 110 when mobile device 100 changes locations and constraining possible bearings to RF leak 104 based on a relationship between changes in the phase angle and the distance between the locations.

Consider that mobile device 100 is located at a first location, which for purposes of discussion is the origin (0,0) of an x-y coordinate system. Starting at the origin, if mobile device 100 is moved along the x-axis a small incremental amount Δx, then an angle $\theta_1$ can be computed which will describe a first spatial cone along the x-axis in 3-dimensions. An apex angle of the first spatial cone will be twice $\theta_1$, and will be at the origin. $\theta_1$ is calculated based on a relationship between the actual phase change of RF signal 110 between (0,0) and (0+Δx, 0), and the phase change that would be expected if mobile device 100 was moved directly towards RF leak 104.

Figure 4:
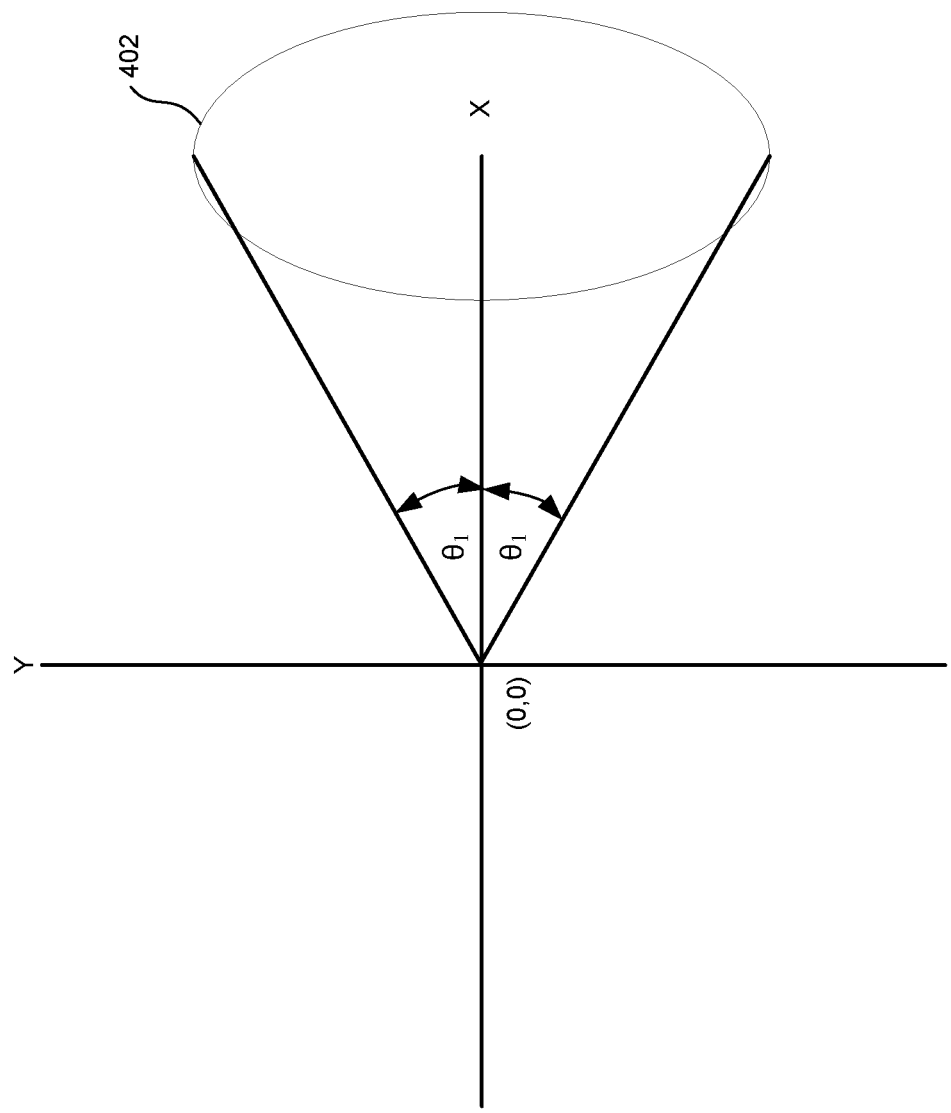
FIG. 4 illustrates a first spatial cone along an x-axis in an exemplary embodiment.

Processor 118 analyzes IQ data 114 generated at a first location (0,0) to determine a first phase angle of RF signal 110 based on IQ data 114 generated at the first location (see step 302 of FIG. 3). Mobile device 100 is moved to a second location (0+Δx, 0), and processor 118 determines a second phase angle of RF signal 110 based on IQ data 114 generated at the second location (see step 304). The distance between the origin (0,0) and (0+Δx, 0) can be determined by mobile device 100 (e.g., utilizing an accelerometer, GPS signals, etc.), and used to calculate an expected phase shift in RF signal 110 that would occur if RF leak 104 were located along the x-axis. For instance, if RF test signal 106 is an 800 MHz CW test signal, then the wavelength would be 37.5 cm. Therefore, one would expect that if mobile device 100 was moved 37.5 cm along the x-axis, that a phase rotation between the first phase determined at (0,0) and the second phase determined at (0+Δx, 0) would be 360 degrees. If the phase difference between (0,0) and (0+Δx, 0) were instead only 270 degrees, then $\theta_1$ is related to 270/360. In particular, $\theta_1$ may be calculated as the Arc cosine of (270/360), which is 41.4 degrees. The apex angle of the first spatial cone is therefore 2 $\theta_1$, or 82.8 degrees, which is calculated based on the phase difference and the distance between the first location and the second location (see step 306). A first spatial cone 402 is illustrated in FIG. 4, which is located at (0,0) and lies along the x-axis. The apex angle for first spatial cone 402 is 2 $\theta_1$, and RF leak 104 lies along a surface generated by first spatial cone 402. First spatial cone 402 therefore confines possible locations of RF leak 104 to its surface. Similar calculation can be performed along the y-axis to generate a second spatial cone and the z-axis to generate a third spatial cone that further constrains the possible locations of RF leak 104.

Figure 5:
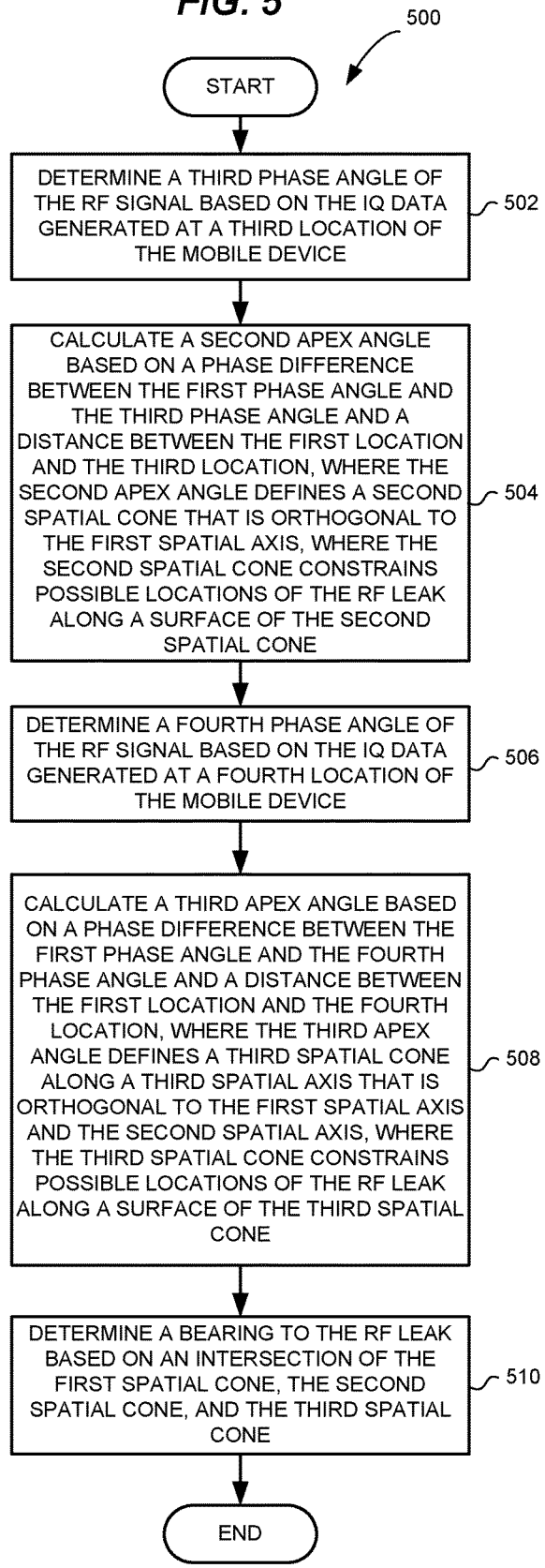
FIG. 5 is a flow chart of a method of determining a bearing to an RF leak emanating from a coaxial cable of a cable plant in an exemplary embodiment.

FIG. 5 is a flow chart of a method 500 of determining a bearing to an RF leak emanating from a coaxial cable of a cable plant in an exemplary embodiment. Method 500 will be discussed with respect to mobile device 100, although method 500 may be performed by other systems, not shown.

Starting at the origin (0,0), if mobile device 100 is moved along the vertical y-axis a small incremental amount Δy, then an angle $\theta_2$ can be computed which will describe a second spatial cone along the y-axis in 3-dimensions. An apex angle of the second spatial cone will be twice $\theta_2$, and will be at the origin. $\theta_2$ is calculated based on a relationship between the actual phase change of RF signal 110 between (0,0) and (0, 0+Δy), and the phase change that would be expected if mobile device 100 was moved directly towards RF leak 104. In this embodiment, the y-axis is orthogonal to the x-axis, and the second spatial cone further constrains possible locations of RF leak 104 along a surface of the second spatial cone.

Figure 6:
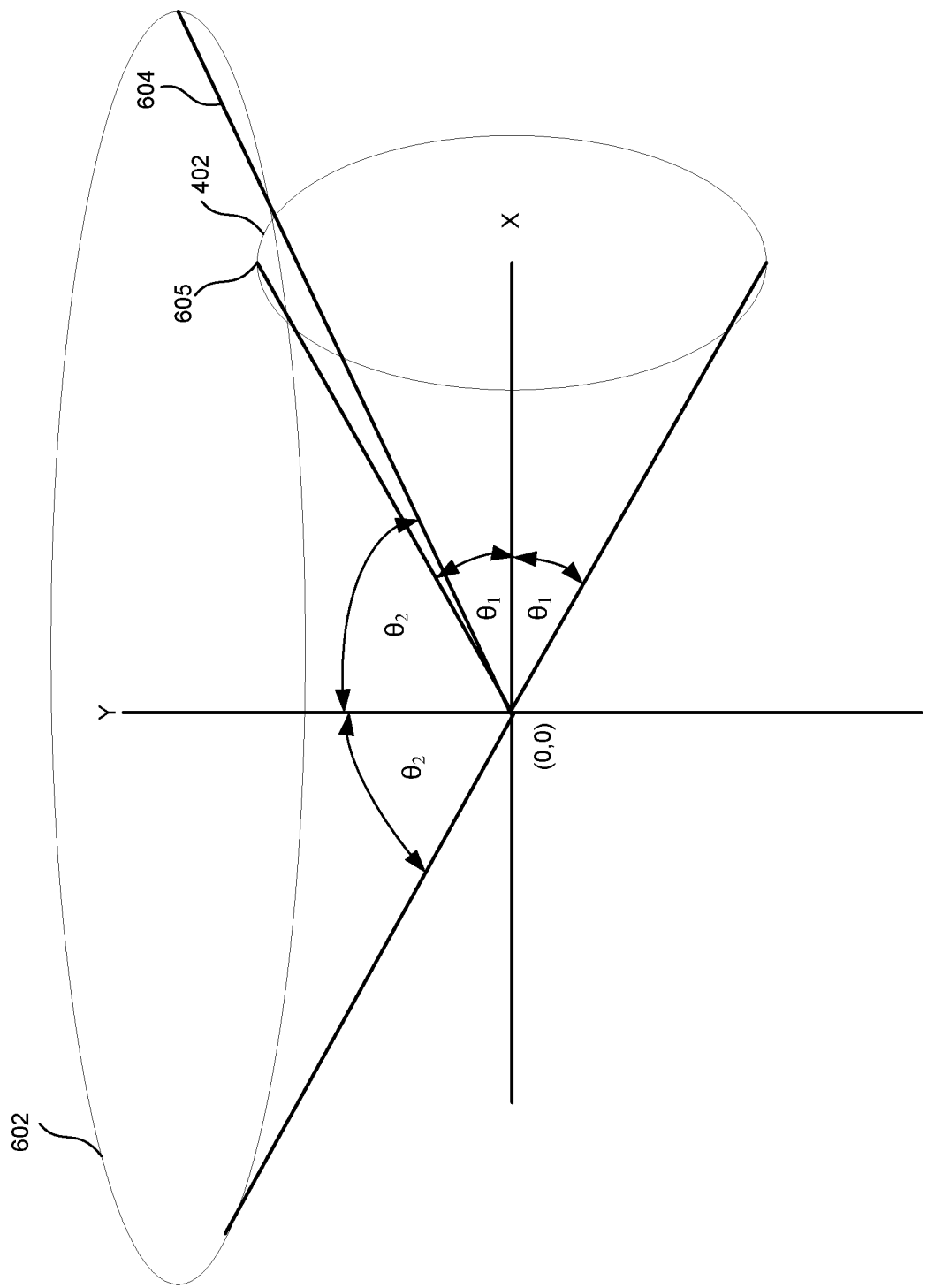
FIG. 6 illustrates a second spatial cone along a y-axis in an exemplary embodiment.

Mobile device 100 is moved to a third location (0, 0+Δy), and processor 118 determines a third phase angle of RF signal 110 based on of IQ data 114 at the third location (see step 502). The distance between the origin (0,0) and (0, 0+Δy) can be determined by mobile device 100, and used to calculate an expected phase shift in RF signal 110 that would occur if RF leak 104 were located along the y-axis. For instance, if RF test signal 106 is an 800 MHz CW test signal, then the wavelength would be 37.5 cm. Therefore, one would expect that if mobile device 100 was moved 37.5 cm along the y-axis, that a phase rotation between the first phase determined at (0,0) and the second phase determined at (0, 0+Δy) would be 360 degrees. If the phase difference between (0, 0) and (0, 0+Δy) were instead only 200 degrees, then $\theta_2$ is related to 200/360. In particular, $\theta_2$ may be calculated as the Arc cosine of (200/360), which is 56.3 degrees. The apex angle of the second spatial cone is therefore 2 $\theta_2$, or 102.6 degrees, which is calculated based on the phase difference and the distance between the first location and the third location (see step 504). A second spatial cone 602 is illustrated in FIG. 6. The apex angle for second spatial cone 602 is 2 $\theta_2$. Using the apex angles calculated for first spatial cone 402 and second spatial cone 602, processor 118 is able to determine bearings to RF leak 104 that are based on the intersection between first spatial cone 402 and second spatial cone 602, which occurs along lines 604-605 in FIG. 6. A bearing to RF leak 104 will lie on one of lines 604-605. Processor 118 may indicate bearings to RF leak 104 on display 122 in some embodiments. If the elevation along a z-axis of RF leak 104 is known, then the elevation may be used to determine which lines 604-605 are the correct bearing. If the elevation along the z-axis of RF leak 104 is not known, then which of lines 604-605 is the correct bearing to RF leak 104 can be calculated using similar techniques as described above for the x-axis and y-axis spatial cones along the z-axis.

Figure 7:
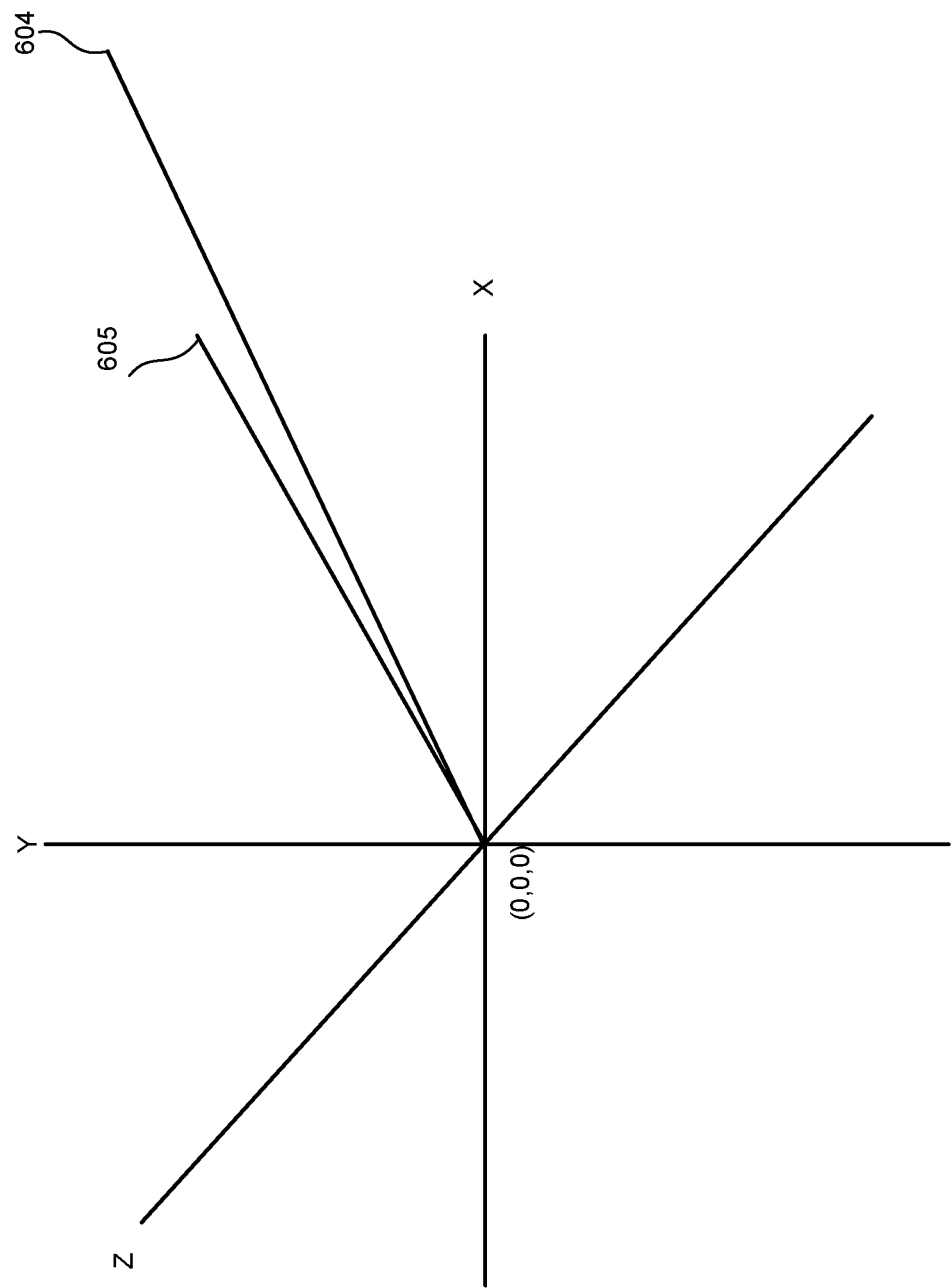
FIG. 7 illustrates two possible bearings to an RF leak in an exemplary embodiment.

Consider that mobile device 100 is located at the first location, which is the origin (0,0,0) of an x-y-z coordinate system illustrated in FIG. 7. FIG. 7 illustrates two possible bearings to an RF leak in an exemplary embodiment. First spatial cone 402 and second spatial cone 602 have been removed for clarity, leaving behind lines 604-605 that represent possible bearings to RF leak 104. Starting at the origin, if mobile device 100 is moved along the z-axis a small incremental amount $\Delta z$, then an angle $\theta_3$ can be computed which will describe a third spatial cone along the z-axis in 3-dimensions. An apex angle of the third spatial cone will be twice $\theta_3$, and will be at the origin. $\theta_3$ is calculated based on a relationship between the actual phase change of RF signal 110 between (0,0,0) and (0,0,0+$\Delta z$), and the phase change that would be expected if mobile device 100 was moved directly towards RF leak 104. In this embodiment, the z-axis is orthogonal to both the x-axis and the y-axis, and the third spatial cone further constrains possible locations of RF leak 104 along a surface of the third spatial cone.

Figure 8:
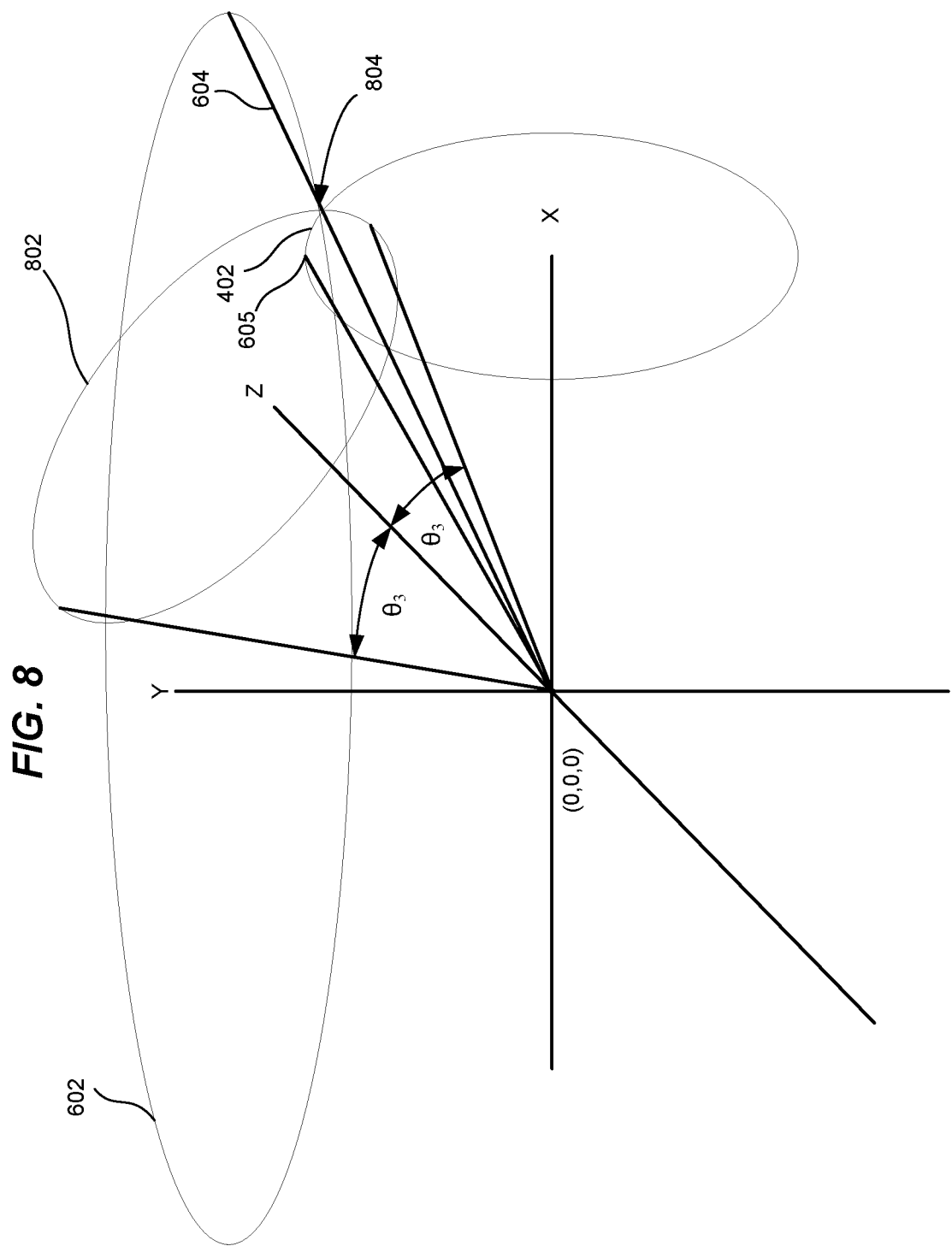
FIG. 8 illustrates a third spatial cone along a z-axis in an exemplary embodiment.

Mobile device 100 is moved to a third location (0,0,0+$\Delta z$), and processor 118 determines a fourth phase angle of RF signal 110 based on IQ data 114 at the third location (see step 506 of FIG. 5). The distance between the origin (0,0,0) and (0,0,0+$\Delta z$) can be determined by mobile device 100, and used to calculate an expected phase shift in RF signal 110 that would occur if RF leak 104 were located along the z-axis. For instance, if RF test signal 106 is an 800 MHz CW test signal, then the wavelength would be 37.5 cm. Therefore, one would expect that if mobile device 100 was moved 37.5 cm along the x-axis, that a phase rotation between the first phase determined at (0,0,0) and the fourth phase determined at (0,0,0+$\Delta z$) would be 360 degrees. If the phase difference between (0,0,0) and (0,0,0+$\Delta z$) were instead only 250 degrees, then $\theta_3$ is related to 250/360. In particular, $\theta_3$ may be calculated as the Arc cosine of (250/360), which is 46 degrees. The apex angle of the third spatial cone is therefore 2 $\theta_3$, or 92 degrees, which is calculated based on the phase difference and the distance between the first location and the fourth location (see step 508). A third spatial cone 802 is illustrated in FIG. 8, which is located at (0,0,0) and lies along the z-axis. The apex angle for third spatial cone 802 is 2 $\theta_3$, and processor 118 determines line 604 is a bearing of RF leak 104 based on an intersection 804 between first spatial cone 402, second spatial cone 602, and third spatial cone 802 (see step 510). Processor 118 may indicate the bearing on display 122 of mobile device 100 in some embodiments.

Figure 9:
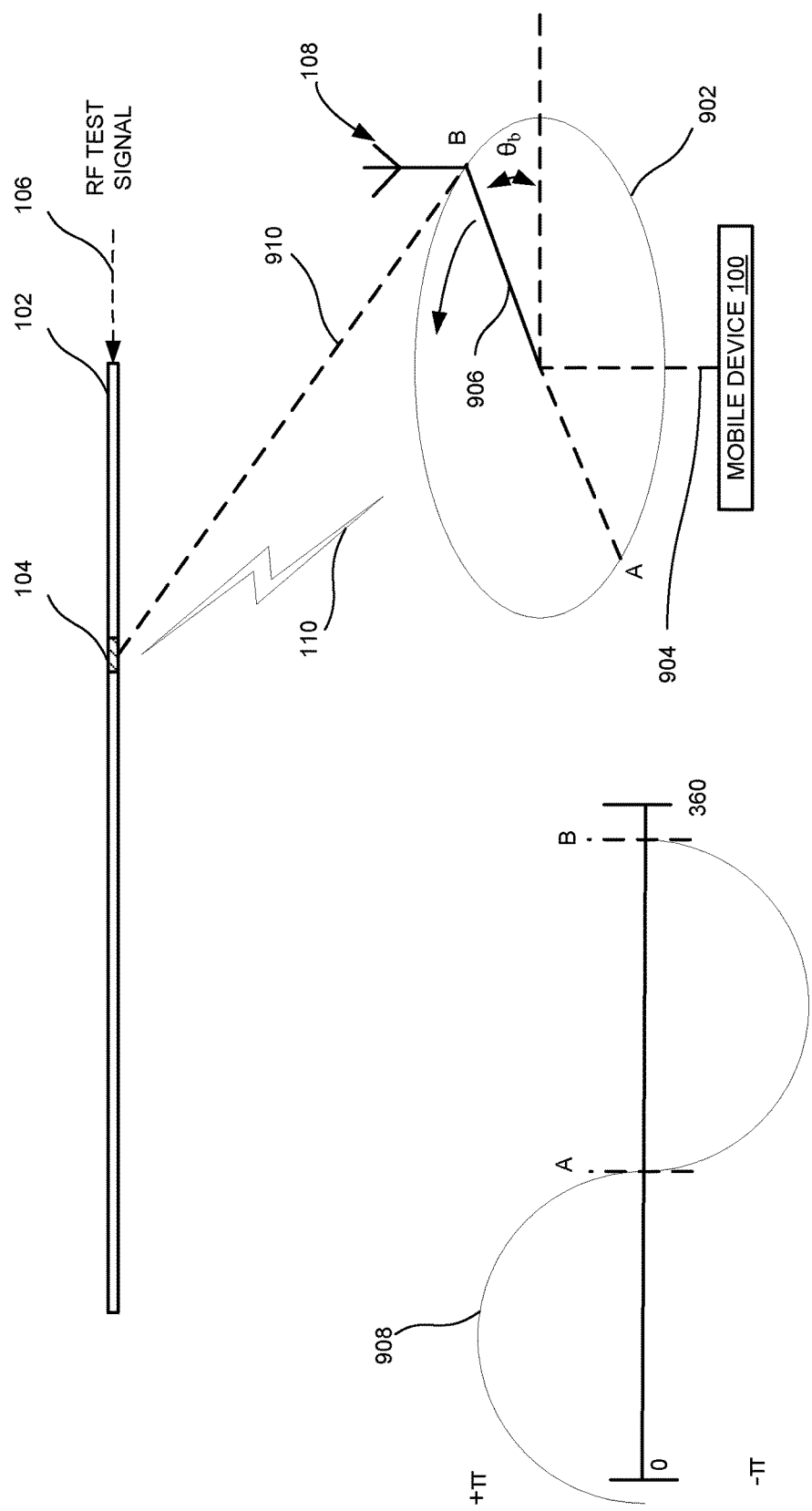
FIG. 9 illustrates the mobile device of FIG. 1 in another exemplary embodiment.
Figure 10:
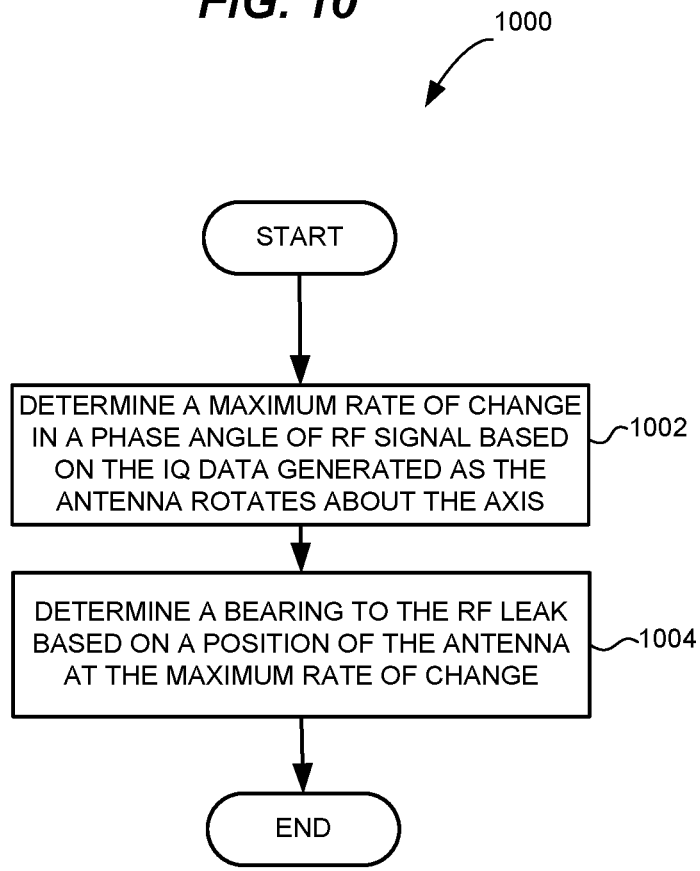
FIG. 10 is a flow chart of another method for determining a bearing to an RF leak emanating from a coaxial cable of a cable plant in an exemplary embodiment.

FIG. 9 illustrates mobile device 100 in another exemplary embodiment. In this embodiment, mobile device 100 includes a member 902 that is configured to rotate about an axis 904. In this embodiment, antenna 108 is mounted to member 902 at a radius 906 from axis 904, and rotates about axis 904 as member 902 rotates. As antenna 108 rotates in the direction indicated in the arrow in FIG. 9, a phase angle 908 of RF signal 110 advances and retards. FIG. 10 is a flow chart of another method 1000 for determining a bearing to an RF leak emanating from a coaxial cable of a cable plant in another exemplary embodiment. Processor 118 determines a maximum rate of change (e.g., the first derivative) of phase angle 908 that is generated as antenna 108 rotates about axis 904 (see step 1002 of FIG. 10). A bearing angle $\theta_b$ of RF leak 104 can be determined by processor 118 based on a position of antenna 108 at the maximum rate of change as member 902 rotates (see step 1004). A tangent from the direction of rotation at point B, where the slope of phase 908 is at a maximum, can be determined from $\theta_b$. Tangent point A will be 180 degrees opposed. A bearing from mobile device 100 to RF leak 104 may be indicated on display 122 by processor 118 in some embodiments.

Figure 11:
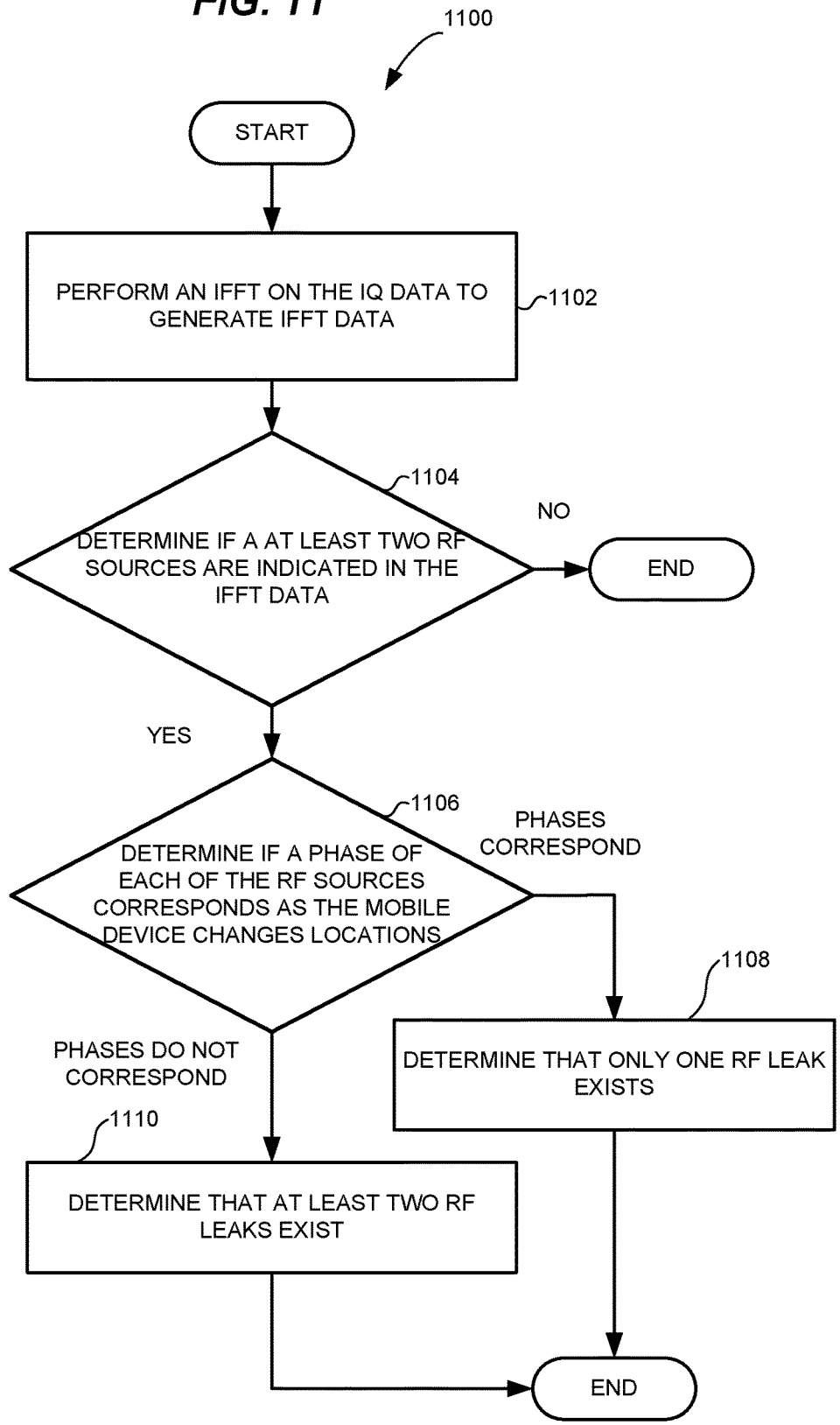
FIG. 11 is a flow chart of a method for determining if multiple RF leaks exist in a coaxial cable of a cable plant in an exemplary embodiment.

In Another embodiment, mobile device 100 performs an Inverse Fast Fourier Transform (IFFT) on IQ data 114 to generate IFFT data, and attempts to determine if multiple RF leaks are present in coaxial cable 102. FIG. 11 is a flow chart of a method 1100 for determining if multiple RF leaks exist in a coaxial cable of a cable plant in an exemplary embodiment. In this embodiment, RF test signal 106 is a wideband RF signal. Some other examples of RF test signal 106 include chirps, sin(x)/x waveforms, pseudo-noise sequences, and Zadoff-Chu sequences.

During operation, processor 118 performs an IFFT on samples of IQ data 114 to generate IFFT data (see step 1102). Processor 118 determines if at least two RF sources are indicated in the IFFT data (see step 1104). If only one RF source is indicated, then method 1100 ends. If at least two RF sources are indicated, then processor 118 determines if a phase of each of the RF sources corresponds as mobile device 100 changes locations (see step 1106). Even if two RF sources are identified in the IFFT data, one RF source may be a reflection of another RF source. If the phases correspond, then processor determines that only one RF leak exists in coaxial cable 102 (see step 1108). However, if the phases do not correspond, then processor 118 determines that at least two RF leaks exist in coaxial cable 102 (see step 1110).

In some embodiments, RF test signal 106 may DOCSIS® pilot signals that are typically transmitted by coaxial cable 102 while providing television and/or data services to customers. The pilot signals do not carry data, and are utilized to characterize the RF channel in coaxial cable 102. In another embodiment, mobile device 100 captures a full set of pilot subcarrier signals at the subcarrier frequencies of the pilot signals, and combines the pilot signals into an OFDM frame. Processor 118 is then able to perform an IFFT on IQ data 114 for the OFDM frame, which generates one or more impulse responses. If the impulses are the result of two or more RF leaks in coaxial cable 102, or the leaks have multipath issues, then the delays of the different impulses will vary from each other as mobile device 100 changes locations. If the delay changes of the individual impulses are tracked as the antenna is moved, each leak can be individually identified and a spatial cone may be created for each leak.

Figure 12:
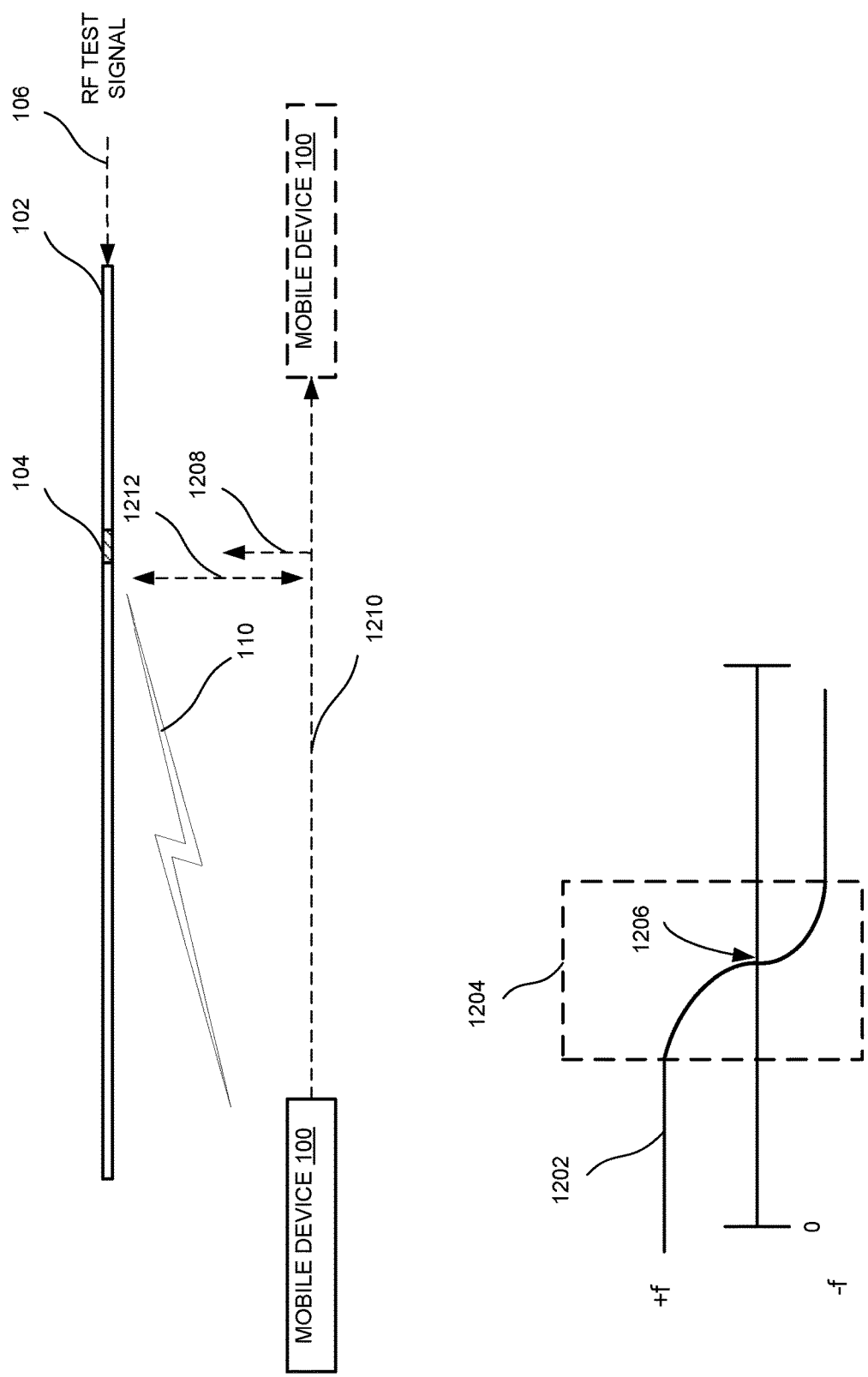
FIG. 12 is a block diagram of the mobile device of FIG. 1 in another exemplary embodiment.

FIG. 12 is a block diagram of mobile device 100 in another exemplary embodiment. In this embodiment, mobile device 100 is able to process IQ data 114 while mobile device 100 is in motion, and determine changes in a frequency 1202 of RF signal 110. For instance, mobile device 100 may be placed in a vehicle, and driven along a road that is proximate to coaxial cable 102. Changes in frequency 1202 provide information to mobile device 100 regarding whether mobile device 100 is traveling toward RF leak 104 or away from RF leak 104. In this embodiment, RF test signal 106 is a test signal at a known frequency.

Figure 13:
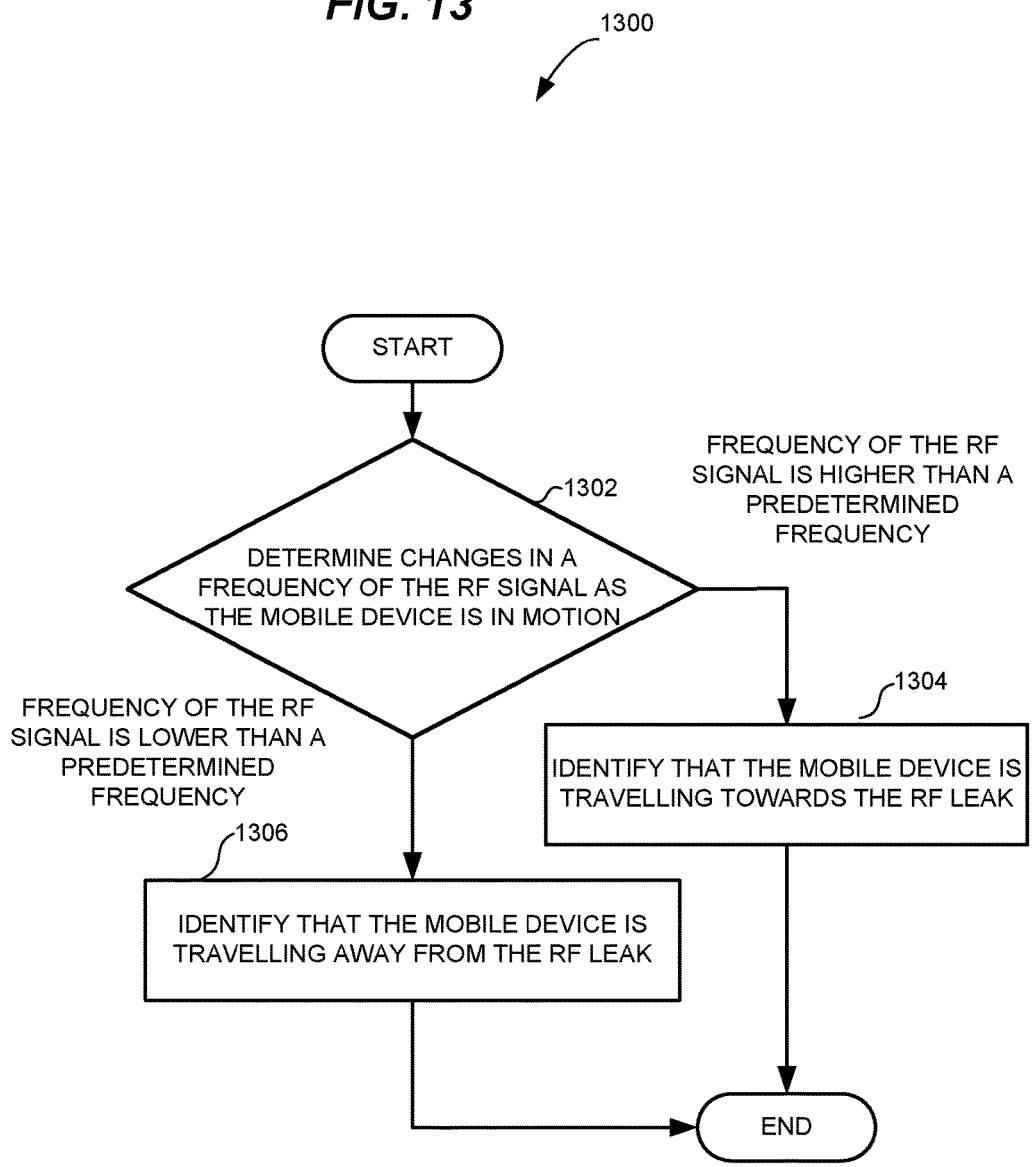
FIG. 13 is a flow chart of another method for detecting RF leaks emanating from a coaxial cable of a cable plant in an exemplary embodiment.

FIG. 13 is a flow chart of another method 1300 for detecting RF leaks emanating from a coaxial cable of a cable plant in an exemplary embodiment. Processor 118 determines changes in frequency 1202 of RF signal 110 as mobile device 100 is in motion (see step 1302). If frequency 1202 of RF signal 110 is higher than the known frequency of RF test signal 106, then processor 118 identifies that that mobile device 100 is traveling towards RF leak 104 (see step 1304). If frequency 1202 of RF signal 110 is lower than the predetermined frequency of RF test signal 106, then processor 118 identifies that mobile device 100 is traveling away from RF leak 104 (see step 1306). A distance 1212 between mobile device 100 and RF leak 104 may be estimated in some embodiments based on the rate at which frequency 1202 transitions. For example, using a slope of frequency 1202 in transition region 1204. The slope may be higher as distance 1212 decreases.

In another embodiment, mobile device 100 is capable identifying a bearing towards RF leak 104 based on a transition region 1204 of frequency 1302 of RF signal 110. As mobile device 100 transitions from travelling toward RF leak 104 to travelling away from RF leak 104, frequency 1204 of RF signal 110 changes from being higher than the known frequency of RF test signal 106 to being lower than the known frequency of RF test signal 106. Transition region 1204 can be analyzed by processor 118 to identify a bearing towards RF leak 104. In this case, a zero crossing point 1206 allows processor 118 to identify a bearing 1208 to RF leak 104 that may be orthogonal to a direction of travel 1210 of mobile device. Using multiple bearings as mobile device 100 travels in different directions, an intersection of the multiple bearings indicates to mobile device 100 a location of RF leak 104.

Figure 14:
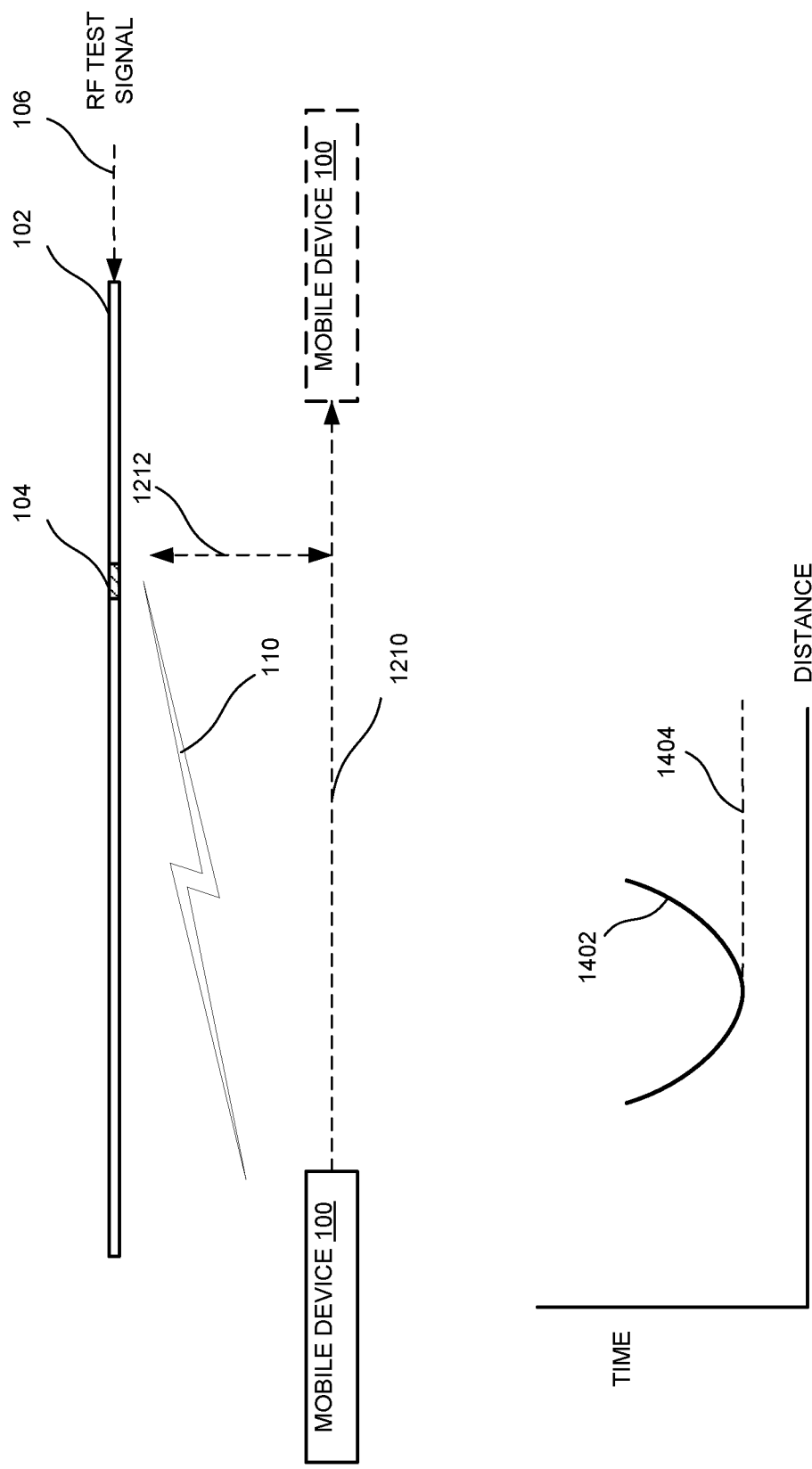
FIG. 14 is a block diagram of the mobile device of FIG. 1 in another exemplary embodiment.

FIG. 14 is a block diagram of mobile device 100 in another exemplary embodiment. In this embodiment, mobile device 100 is able to identify a location of RF leak 104 by analyzing an absolute delay between the transmission of RF test signal 106 and the reception of RF signal 110 by mobile device. As antenna 108 of mobile device 100 is brought closer to RF leak 104, a phase angle 1402 of RF signal 110 decreases to a minimum value at point 1404, which indicates that antenna 108 of mobile device 100 is proximate to RF leak 104.

Figure 15:
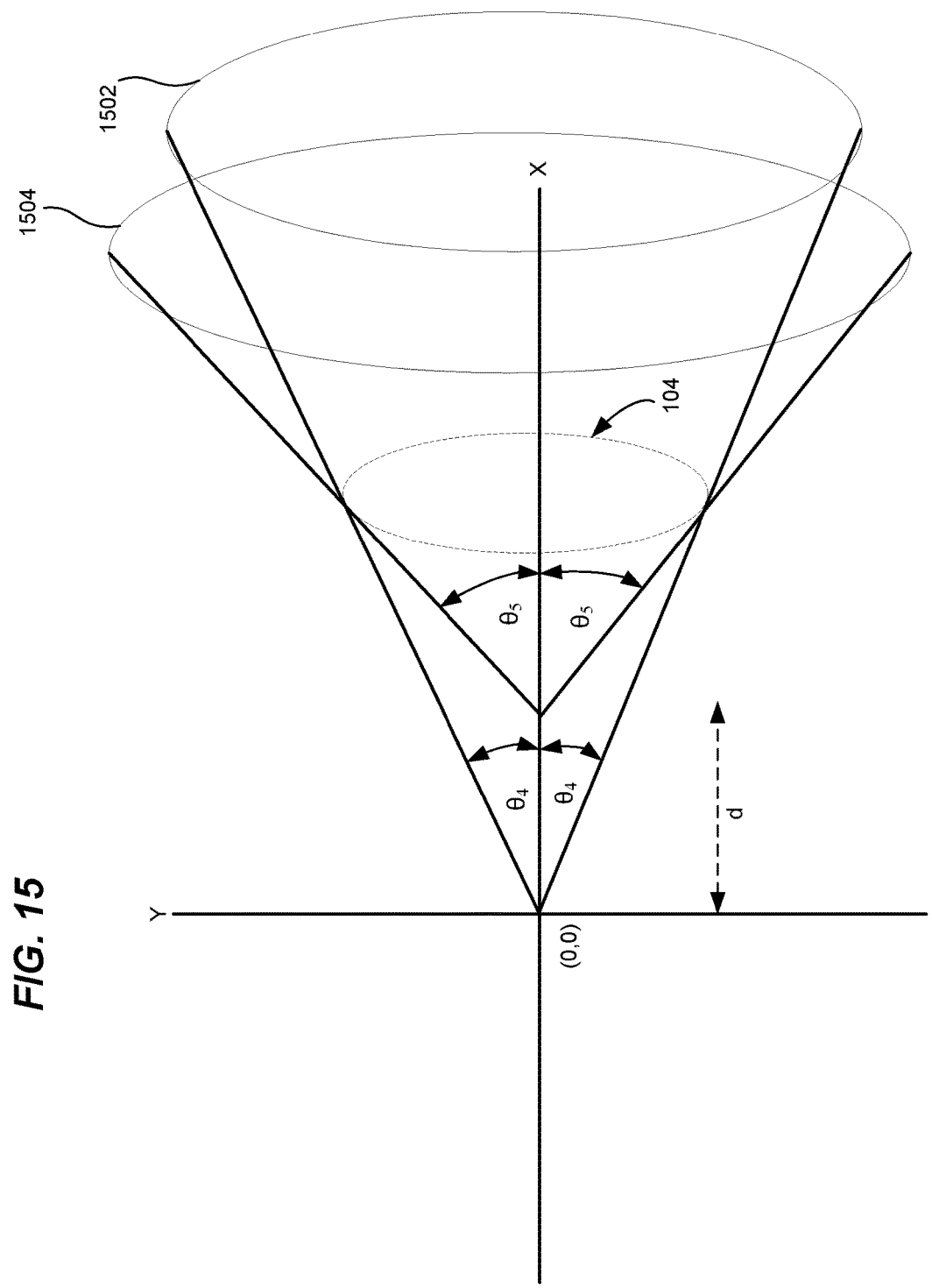
FIG. 15 illustrates spatial cones that are not located at the origin in an exemplary embodiment.

In another embodiment, mobile device 100 is capable of detecting information about RF leaks utilizing multiple spatial cones that are not located at the origin, which is illustrated in FIG. 15. In this embodiment, spatial cone 1502 is located along the y-axis, and spatial cone 1504 is located along the x-axis. However, spatial cone 1504 is not located at the origin (0,0) in this embodiment. Rather, spatial cone 1504 is located some distance (d) along the x-axis from the origin, which places a location of RF leak 104 somewhere on a circle that is created when spatial cone 1502 intersects spatial cone 1504. In this embodiment, $\theta_4$ and $\theta_5$ are different angles.

As discussed previously, an accurate source clock onboard mobile device 100 may be utilized in order to accurately identify subtle changes in the phase angle and/or the frequency of RF signal 110. One of the challenges in leakage detection is the use of a very stable reference signal source. This may be provided by using a Rubidium-based or Cesium-based frequency standard, which are commercially available. Another approach is the use a GPS-referenced clock.

These challenges may be mitigated by transmitting an RF test signal with a built-in reference. One option includes the use of two CW RF test signals separated by a fixed frequency, such as 10 MHz. Other options include the use of modulation, such as Amplitude Modulation (AM) or Binary Phase Shift Keying (BPSK), or downstream DOCSIS® 3.1 signals which can have a bandwidth nearing 200 MHz.

At mobile device 100, the RF signals could be demodulated to derive the clock, which would be used to as a reference for mobile device 100. If two tones were used, they could be mixed together to produce a lower stable reference. The current Ettus B200 Software Defined Radio (SDR) receiver uses a 10 MHz reference. The recovered symbol clock or difference frequency can be used to lock-up a phased lock loop (PLL) generating a stable 10 MHz.

Using RF test signals with a built-in reference works even when there is Doppler shift, because the frequency of the modulation is not strongly affected by Doppler. Instead, the center frequency will be affected. Ideally you want the modulated signal, or two CW RF test signals, to be close enough in frequency to have very similar transmission path characteristics. One possible range for the recovered clock is 0.1-200 MHz. After recovering a stable clock, either or both tones can be demodulated into IQ data samples. The stable clock may also be derived from a data signal, such as a DOCSIS 3.1 OFDM® downstream signal.

A problem arises when there is more than one signal source, or one signal source is reflecting and producing multipath. In this RF environment the trajectory of the IQ plot is no longer circular, but appears to move randomly, sometimes temporarily passing through the origin at a location where all received signals cancel due to vector phase addition or subtraction. The presence of multiple sources and be detected by measuring and saving IQ values at uniform distances while the antenna is traveling in a straight line. Mobile device 100 may perform Fourier transform such as a Discrete Fourier Transform (DFT) or a FFT on saved IQ data 114 to generate transformed data, which may reveal if multiple RF leaks or reflections are present. Ideally the samples are evenly spaced and the numbers of samples is 2 raised to an integer power, and all sample locations taken while antenna 108 is traveling in a straight line. Optionally the set of samples may be windowed to reduce a characteristic called leakage. After windowing the data set is transformed using a DFT. The data are analyzed and more data is gathered. If, for example a 64 point Fourier transform is being performed, a smoother display can be obtained by replacing some of the older samples with newer samples. Use of a windowing technique before performing a Fourier transform reduces leakage and produces clearer peaks in the transform. This test method may be viewed as a type of synthetic phased array.

Utilizing the various analytical techniques described, locating and mitigating RF leaks in coaxial cables of a cable plant can be performed more quickly and efficiently. This allows the cable operator of the cable plant to unsure that the RF leakage levels enforced by the FCC are in compliance.

Any of the various elements shown in the figures or described herein may be implemented as hardware, software, firmware, or some combination of these. For example, an element may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non-volatile storage, logic, or some other physical hardware component or module.

Also, an element may be implemented as instructions executable by a processor or a computer to perform the functions of the element. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

Figure 16:
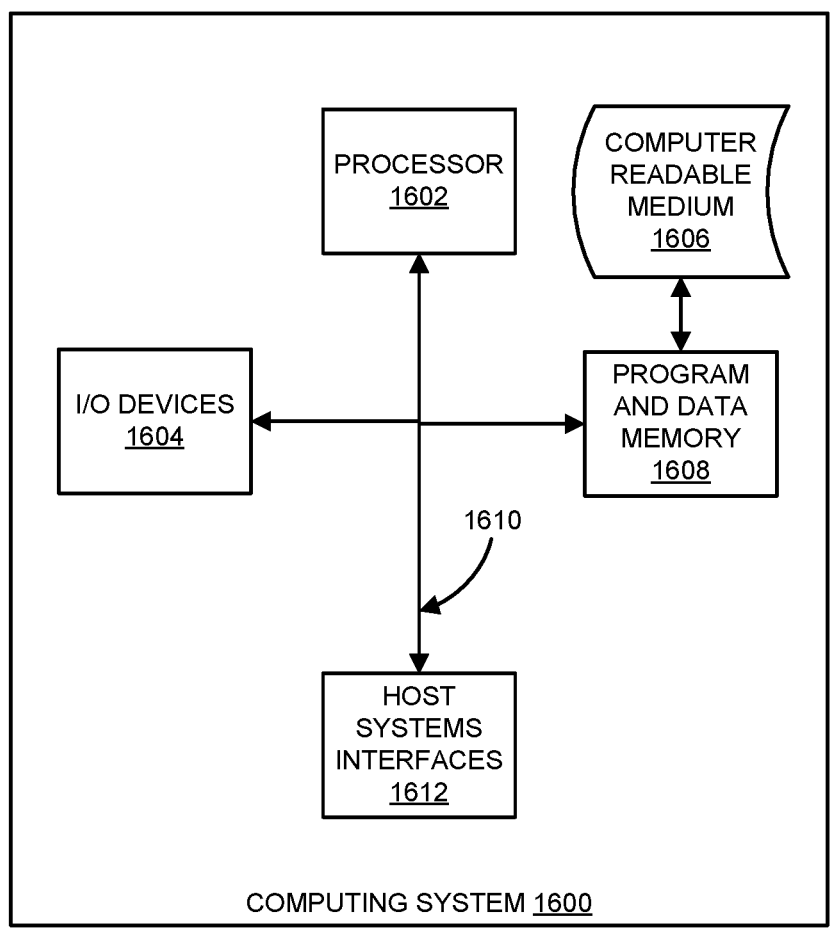
FIG. 16 is a block diagram of an exemplary computing system in which a computer readable medium provides instructions for performing the methods described herein.

In one embodiment, the invention is implemented in software, which includes but is not limited to firmware, resident software, microcode, etc. FIG. 16 illustrates a computing system 1600 in which a computer readable medium 1606 may provide instructions for performing any of the methods disclosed herein.

Furthermore, the invention can take the form of a computer program product accessible from the computer readable medium 1606 providing program code for use by or in connection with a computer or any instruction execution system. For the purposes of this description, the computer readable medium 1606 can be any apparatus that can tangibly store the program for use by or in connection with the instruction execution system, apparatus, or device, including the computer system 1600.

The medium 1606 can be any tangible electronic, magnetic, optical, electromagnetic, infrared, or semiconductor system (or apparatus or device). Examples of a computer readable medium 1606 include a semiconductor or solid state memory, magnetic tape, a removable computer diskette, a random access memory (RAM), a read-only memory (ROM), a rigid magnetic disk and an optical disk. Some examples of optical disks include compact disk-read only memory (CD-ROM), compact disk-read/write (CD-R/W) and DVD.

The computing system 1600, suitable for storing and/or executing program code, can include one or more processors 1602 coupled directly or indirectly to memory 1608 through a system bus 1610. The memory 1608 can include local memory employed during actual execution of the program code, bulk storage, and cache memories which provide temporary storage of at least some program code in order to reduce the number of times code is retrieved from bulk storage during execution. Input/output or I/O devices 1604 (including but not limited to keyboards, displays, pointing devices, etc.) can be coupled to the system either directly or through intervening I/O controllers. Network adapters may also be coupled to the system to enable the computing system 1600 to become coupled to other data processing systems, such as through host systems interfaces 1612, or remote printers or storage devices through intervening private or public networks. Modems, cable modem and Ethernet cards are just a few of the currently available types of network adapters.

Figure 17:
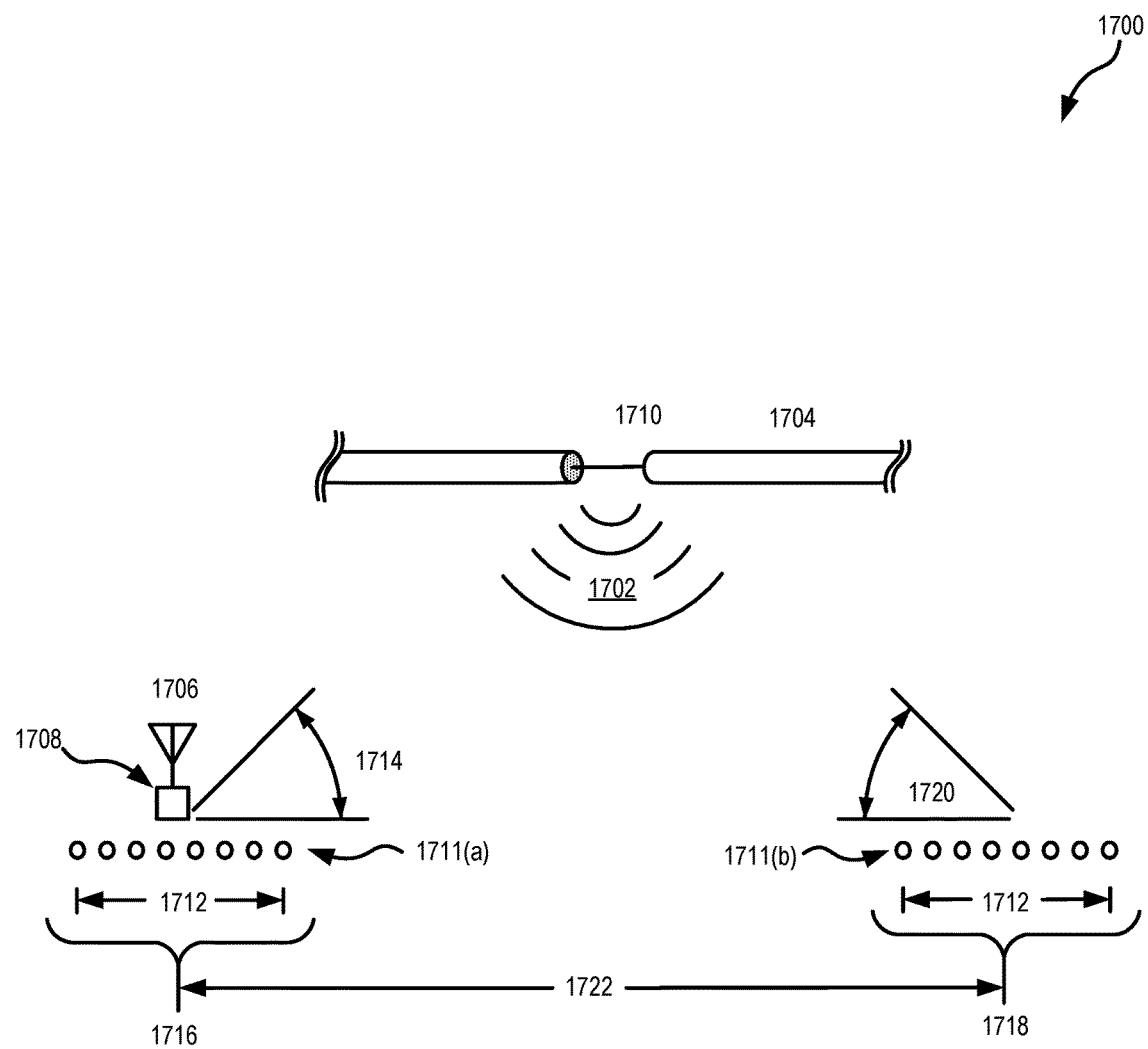
FIG. 17 illustratively represents a system utilizing a single receive antenna for locating leakage antennas, in an embodiment.

FIG. 17 is a diagram 1700 illustratively representing a cable 1704 within a cable plant that has damage to the cable's shield, which causes it to act as a stationary leakage antenna 1710. Such damage is common in cable plants and may be caused by, for example, corrosion, stress fractures, animal chews, technician error, and construction vehicle error.

The cable 1704 transports a leakage test signal 1702, and example of which is a stable continuous wave (CW) carrier or other deterministic signal, such as a DOCSIS 3.1 signal with pilots. The leakage test signal radiates to a mobile test antenna 1706 which is connected to a complex demodulator mobile receiver 1708, at a first antenna location 1716. The complex demodulator 1708 produces an in-phase (I) and quadrature (Q) signal sample for each of 'N' incremental steps 1711 over a synthetic phased array (SPA) distance 1712 as the receive antenna 1706 moves. In one example, incremental steps 1711 are separated by 15 cm and the number of incremental steps 'N' is an integer value such as 8 (as shown in FIG. 17) or 128, or may be, for example, 2 raised to some integer exponent. The samples are each processed by a well-known discrete inverse Fourier transform, the output of which is a set of Doppler frequencies.

In one embodiment, the mobile receive antenna 1706 were moving directly towards a leakage antenna 1710 at a velocity of 40 meter/sec and the CW test signal frequency is 900 MHz. The test signal's wavelength is readily computed as 3E8 meters per second (speed of light) divided by 900E6 Hz=0.333 meters. The Doppler frequency can then be computed as 40/0.333 or 120 Hz. However, if the Doppler frequency is a lower value, such as 80 Hz (at the 40 meter/sec antenna velocity), the mobile receive antenna 1706 is not moving directly towards the leakage antenna 1710, but moving at an angle to the leakage antenna 1710. A bearing angle 1714 (or bearing angle 1720) may be calculated as Acos(80/120)=48.19 degrees.

Test antenna 1706 them moves to a second antenna location 1718 separated by a distance 1722 at which point second set of I-Q samples is generated. The second set of I-Q samples is then processed by a Fourier transform and, as described above for the first set of I-Q samples, a second bearing angle 1720 is produced using known methods. The intersection point of bearing angle 1714 from antenna location 1716 and bearing angle 1720 from antenna location 1722 shows the location of the leakage antenna 1710.

In practice, many bearing angles can be computed from many antenna locations, increasing the accuracy of the determination of the location of leakage source 1710 by averaging. Likewise a larger value of 'N' produces improved bearing angle resolution.

In one embodiment, mobile receiver 1708 is a software defined radio (SDR) such as Ettus Model B210 connected to a computing device, such as a portable computer, Raspberry Pi, O-Droid computing device, or similar device.

In an embodiment, mobile receive antenna 1706 is an L-com monopole with omnidirectional antenna pattern, or similar.

To achieve the necessary stability of both the leakage test signal 1702 and mobile receiver 1708 a Rubidium test standard may be employed. For example a Frequency Electronics Model 5680A may be used in both stationary and mobile locations. Alternately a GPS (global positioning system) disciplined oscillator, such as offered by Trimble Navigation, may be employed for the stable frequency references.

One complication can occur when mobile receive antenna 1706 travels in a straight line such that ambiguity is created regrading which side of the road a leakage signal is on, that is, the intersections of bearing angles 1714, 1720 produced by the Acos function create a real location and a false location of leakage signal 1710. The bearing angle is actually half of the apex angle of a solid three dimensional cone, where the apex of the cone is antenna location 1716 or antenna location 1718. A three dimensional cone will intersect the ground along two lines, and the false line needs to be eliminated.

If the path of the test antenna wavers, such as when a vehicle carrying the equipment turns or changes lanes, the intersection points will converge in the correct direction and diverge in the false direction.

Figure 18:
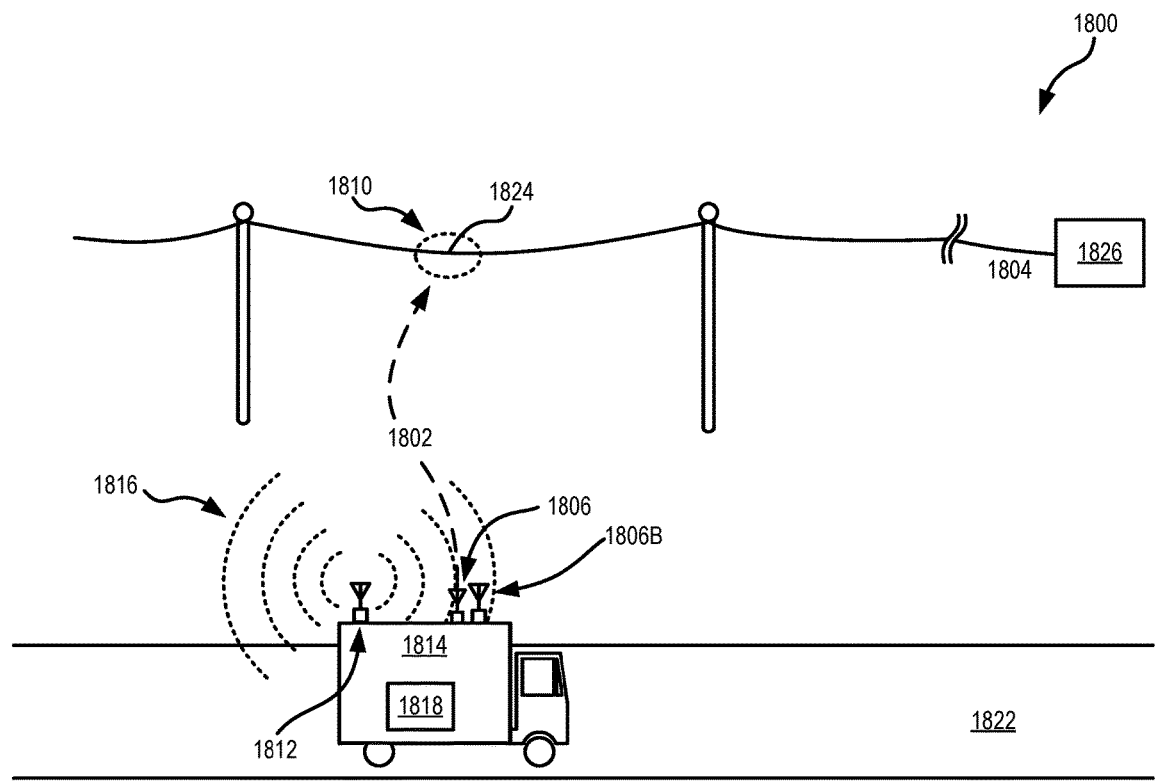
FIG. 18 illustratively represents a system utilizing a two transmit antennas for locating leakage antennas, in an embodiment.

In another embodiment (similar to that shown in the transmit embodiment of FIG. 18), a second mobile receive antenna (not shown but similar to the second mobile receive antenna 1806B in FIG. 18) is locate proximate to the first mobile receive antenna 1706 and connected to another second mobile receiver. The mobile receive antenna may be placed alongside mobile receive antenna 1706 at, for example, a separation distance of 1-1.5 meters. The relative phase shifts between the mobile receivers 1708 and the second mobile receiver reveals the direction of a leakage source. That is, the leakage source will be on the side that experiences a higher Doppler frequency as the leakage antenna 1710 is passed.

In another embodiment, two antennas are connected to a switch, such as an electronic double pole switch, that multiplexes or alternatively connects the two antennas to a single receiver, such that only a single receive is required thereby reducing cost of implementation. In a single receiver embodiment, a computer that receives data from the SDR (discussed above) may control the switch between the two antennas. By either adding additional antenna feed cable to one antenna or modifying antennas positions such that one is slightly forward of the other, the measurement points can be made at the same horizontal location as shown in FIG. 17. This could be done for cost reduction, power reduction, or weight reduction such as may be beneficial in an airborne, terrestrial, or cable "walking" drone implementation.

Usable with a GPS configured system, although not illustrated, is a GPS data logger receiver for recording antenna position as measurements are made such that data point may be geographically located. One example of such a PGS data logger received is a Columbus model V-800. From the GPS data the latitude, longitude values of leakage antennas, such as leakage antenna 1710 is located and recorded. It is also useful to record the strength of the leakage signal as well as the drive path that the mobile receive antenna 1706 took, date, and time.

It should be noted that the use of a CW carrier test signal with a SPA provides for extreme sensitivity due to the narrow receiver noise bandwidth, and the processing gain and directional properties of the SPA.

The embodiment described in FIG. 17 may be utilized in multiple ways. It can be carried by a human or placed on a cart, where an accelerometer may cooperate with the system to provide uniform I-Q samples. The present system and method may also be mounted on a vehicle, examples of which include by are not limited to a cable service vehicle, a taxi, or a delivery vehicle. Likewise the embodiment can be flown by a manned aircraft or drone. When aerial, geometry considerations vary relative to ground testing. For example, when driving the 3-D cone intersects with the ground along a "V" shape. However, when flying the ground (containing the leakage antenna) intersects slices the 3-D cone along a hyperbola, assuming level flight. So geometric leakage calculations are made in three dimensions or four dimensions when time is included.

Testing can be automatic, where a driver of a vehicle is not aware test data is being gathered. In this mode the collected leakage data can be uploaded over a wireless link, for example, when the vehicle is parked near a wireless data receiving unit.

The data obtained by leakage detection can be manually or automatically placed into a data base and processed. By way of example, processing may focus on proactive network maintenance, troubleshooting interference with wireless services, or tracking new leaks or leaks that vary with time and weather.

Research has indicated that cable leakage severity depends on a frequency of a test signal. Thus it is valuable to test at different frequencies. This can be done by changing the frequency of the test signal periodically. The antenna 1706 can be changed out for a new frequency antenna or a multiband antenna can be used. Alternately, an antenna may be used at a non-specified frequency and a correction factor can be applied to the recorded data.

FIG. 18 shows environment 1800 with the antenna system similar to that of FIG. 17 configured on a truck. The antenna reciprocity theorem states that the transmit and receive properties of associated antennas are identical. Hence, it is also possible to transmit from one or more moving antennas and receive at the leakage antenna.

In the embodiment of FIG. 18, a mobile transmit antenna 1806 is mounted on a vehicle 1814, traveling down a road 1822, and emitting a test signal 1802. The test signal 1802 is received by a receive leakage antenna 1810 created by a shield break 1824. Test signal 1802, which may be a CW carrier, is generated by a moving test signal transmitter 1818. The received test signal is received at leakage antenna 1820 and propagates through cable line 1804 to a stationary receiver 1826. The stationary receiver 1826 may be at a fiber node, a hub site, a headend, in a home, or placed in the system for the present testing procedure. As mobile test antenna 1806 drives past leakage antenna 1810 Doppler shift information is collected at stationary receiver 1826, similar to the moving receiver embodiment, discussed above.

One complexity in the transmit system is determining the exact travel path and timing of the mobile transmit antenna 1806 relative to the reception of the leakage test signal by the stationary receiver 1826. A position transmitting antenna 1812 may optionally be configured with vehicle 1814 such that it travels with moving transmit antennas 1806, 1806B. Antenna 1812 functions to send a position carrier 1816 with the latitude, longitude, and velocity of the vehicle 1814 to a position receiver, not shown. In another embodiment leakage antenna 1810 also receives the position carrier 1816. If nearby frequency band to the test signal's frequency is utilized for the position carrier 1816, a common single antenna may be used for both test signal 1802 and position carrier 1816 by combining the transmitted signals before connecting them to the common single antenna.

Note that the present transmit system, which utilizes a single test signal 1802 from a single mobile transmit antenna 1806, has a similar left-right ambiguity problem as the embodiment discussed in FIG. 17. This problem can be similarly resolved by locating a second mobile transmit antenna 1806B on vehicle 1814 proximate to antenna 1806. Test signal 1802 can be switched between transmitting antennas 206 and 206B rapidly by switch 220. The stationary receiver would synchronously switch output streams, recovering interleaved I-Q samples from both antennas at different times.

Figure 19:
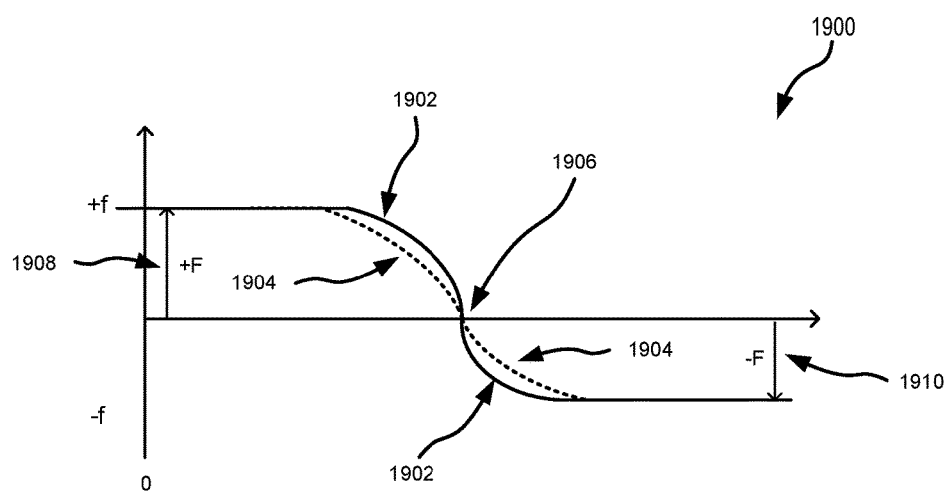
FIG. 19 is a diagram showing two Doppler frequency vs. distance plots to determine if leak is on the left or right, in an embodiment.

FIG. 19 is plot diagram 1900 that illustrates two Doppler shift vs. distance plots. It will be understood that the distance axis of plot diagram 1900 may be adapted to time if velocity is uniform over a given span. FIG. 19 is discussed in relationship to FIG. 18 and should be read as such.

A first plot 1902 is produced from mobile transmitting antenna 1806 when it is at a first closer distance from shield break 1824. A second plot 1904 is produced from mobile transmitting antenna 1806B when it is at a second farther distance from shield break 1824.

In an embodiment, a switch may be utilized to change between transmit antennas 1806, 1806B every 15 cm such that the SPA distances for each antenna 112 overlap. The antenna closer to leakage antenna 1810 (antenna 1806 in FIG. 18) has an increased Doppler frequency change relative to the antenna farther away (antenna 1806B in FIG. 18) due to faster rotation of phase. This feature makes it possible to eliminate the false leak image. Note that when the antenna's bearing angles are 90 degrees the plots will cross.

In an embodiment, the present system and method may provide additional information to stationary receiver 1826 to instruct it as to which antenna's signal is currently being received. For example antenna 1806 may be configured to transmit slightly longer than antenna 1806B by varying the duty cycle of switch 212 from 50-50 to 55-45.

The distance point of plot 1900 where the Doppler frequency goes through zero (hereinafter, zero point 1906) represents where the shield break is at right angles to the travel path of the antennas 1806, 1806B. Note that when the leakage antenna is far away from the antenna, the Doppler frequency approaches +F 1908 or −F 1910, which can be calculated from the wavelength and antenna velocity.

Note that test signals travel at almost the speed of light, but the antenna velocity is much, much lower. The antenna velocity is used for Doppler frequency calculations. If a test antenna is driving at 40 meters per second, and the antenna acquires I-Q data point every 15 cm then the capture rate is one sample every 3.75 ms. Assuming a leak antenna, such as leakage antenna 1810, is 100 meters away from the mobile antenna, such as antenna 1806, 1806B, then the signal transit time between then is approximately 0.000333 ms, which can be considered virtually instantaneous.

If it is desired to have a constant distance between synthetic phased array elements, such as 15 cm, sampling rates can be sped up as antenna velocity increases. Testing can even be done semi-statically if desired. That is, an I-Q measurement is made, the antenna is moved 15 cm and another I-Q measurement is made, which continues until enough samples are captured to perform a Fourier transform and make a SPA.

Figure 20:
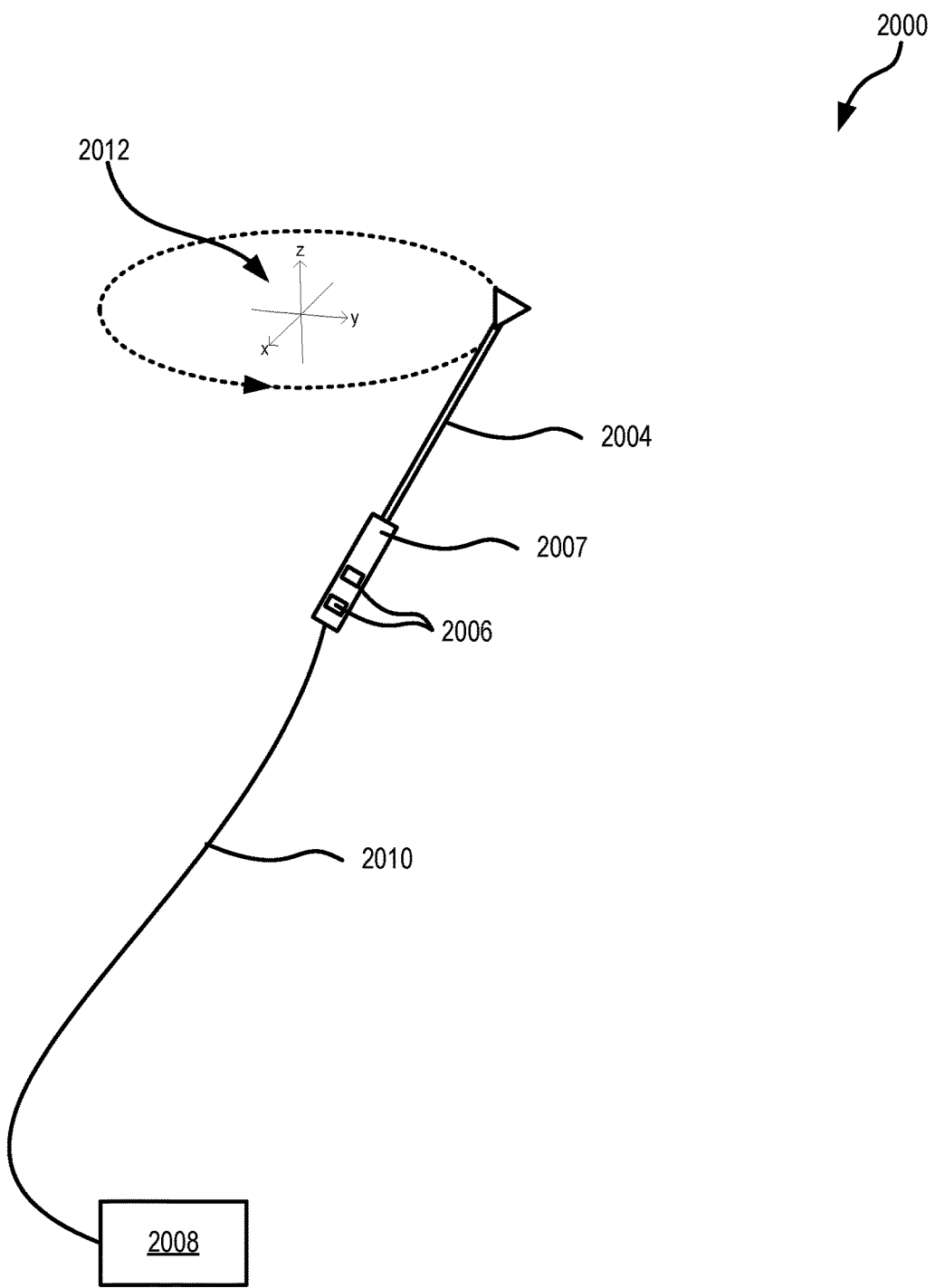
FIG. 20 illustratively represents moving an antenna in a space to determine from the mapped electromagnetic field in that space where leakage antennas are located, in an embodiment.

FIG. 20 is a diagram 2000 that illustrates a hand holdable antenna 2004 with one or more accelerometers 2006 in a base 2007, and a receiver/computing/display device 2008. The embodiment of FIG. 20 is primarily intended for indoor leakage antenna location, as may be utilized inside a home or apartment building, although it also functional outdoors. As a technician (not shown) moves antenna 2004, received signal values are sent to receiver 2008 and accelerometer voltage samples, from accelerometer(s) 2006 are simultaneously sent to receiver 2008 over cable 2010. The three X, Y, and Z axes 2012 of antenna 2004 are located by computation elements within receiver 2008 utilizing the accelerometer data and received data. As the technician traces a circle with the antenna horizontally in an X-Z plane, the I-Q field strength values are recorded, along with the position of the antenna. This process may be repeated in the X-Y plane and in the Y-Z planes, forming a three dimensional (3-D) field strength map. From the field strength map the direction to the leakage antenna(s) may be determined. Indoor locations are frequently more difficult to analyze than outdoor applications because the leakage signal suffers multipath distortion, as well as diffraction.

Another motion pattern that the technician can use for antenna 2004 is a straight line in each of the X, Y, and Z axes. Processing can be done as discussed in the parent (allowed) application.

Yet another motion pattern that the technician can use is a zig-zag pattern where a two dimensional plane of (relatively) evenly-spaced samples are captured. Samples are captured while antenna is moved left-to-right while holding the forward position steady. Next, the antenna is advanced and moved right-to-left to get another set of samples. This is repeated until a test area is covered. This set of samples may be transformed with a 2-dimension IFFT to reveal the direction to a leakage signal. Likewise this technique can be used in 3-dimensions. While a computer-controlled actuator can give more accurate sample spacing relative to a human moving the antenna, the errors produced by a human moving the antenna can be reduced by interpolation.

The hardware and software utilized in the embodiment of FIG. 20 are similar to that described above for the many other embodiments.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

The invention claimed is:

1. A system for locating one or more leakage antennas radiating a leakage signal from a cable plant, comprising:
a first mobile test antenna connected to a mobile receiver producing I and Q samples as the mobile test antenna moves a synthetic phased array (SPA) distance;
a Fourier transformer module for converting a first set of I and Q samples into a first set of Doppler frequency components associated with a first test antenna location and a second set of I and Q samples into a second set of Doppler frequency components associated with a second antenna location;
a conversion module configured to convert the first set of Doppler frequency components into first bearing angle associated with the first test antenna location and the second set of Doppler frequency components into second bearing angle associated with the second antenna location;
wherein the location of the one or more leakage antennas is determined as the location where said first bearing angle from the first test antenna location intersects said second bearing angle from the second test antenna location.

2. A system according to claim 1, further comprising a second mobile test antenna connected to second mobile receiver that produces a third set of I and Q samples which is processed to resolve left-right location ambiguity.

3. A system according to claim 1, further comprising a second mobile test antenna and a switch connecting said first mobile test antenna and said second mobile test antenna to said receiver, the receiver alternately connecting the first mobile test antenna and the second mobile test antenna to the receiver.

4. A system according to claim 1, further comprising changing test signal frequencies to determine the severity of the one or more leakage antennas.

5. A system for detecting one or more leakage antennas that receive a first transmitted test signal, comprising:
- a mobile transmit antenna connected to a test signal transmitter which transmits the first transmitted test signal;
- a stationary receiver and processing unit connected to the one or more leakage antennas for receiving and processing mobile transmit antenna generated signals and producing a first and second set of I and Q samples as a result of said processing;
- a location processing unit for determining the location of a first test antenna location and a second test antenna location; and
- a Fourier transformer processing unit for converting the first set of I and Q samples into a first set of Doppler frequency components associated with the first test antenna location and converting the second set of I and Q samples into a second set of Doppler frequency components associated with the second test antenna location; and
- a bearing angle processing unit configured to convert of first set of Doppler frequency components into a first bearing angle associated with the first test antenna location and the second set of Doppler frequency components into a second bearing angle associated with the second test antenna location;
- further comprising a second mobile transmit antenna which transmits a second transmitted test signal which is received at the one or more leakage antennas and stationary receiver and is processed by the processing unit to resolve left-right location ambiguity
- wherein the location of the leakage antenna is determined as the location where said first bearing angle from first test antenna location intersects said second bearing angle from second test antenna location.

6. A system according to claim 5, further comprising a data storage unit for recording leakage data.

7. A system according to claim 6, wherein leakage data is automatically recorded when said mobile transmit antenna is in a region with the first or second transmitted test signal, and data gathering is suspended when said mobile transmit antenna is outside the region with the first or second transmitted test signal.

8. A system according to claim 1, further comprising a GPS data logger for associating latitude and longitude data with the one or more leakage antennas.

* * * * *